US012692281B2

(12) United States Patent
Ishibe et al.

(10) Patent No.: US 12,692,281 B2
(45) Date of Patent: Jul. 28, 2026

(54) FILM AND LIGHT-EMITTING DEVICE INCLUDING THE SAME

(71) Applicant: Samsung Electronics Co., Ltd., Suwon-si (KR)

(72) Inventors: Satoko Ishibe, Suwon-si (KR); Joonghyuk Kim, Seoul (KR); SangYeon Hwang, Seoul (KR); Sangmo Kim, Hwaseong-si (KR); Yusuke Maruyama, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 999 days.

(21) Appl. No.: 17/751,855

(22) Filed: May 24, 2022

(65) Prior Publication Data

US 2022/0393109 A1 Dec. 8, 2022

(30) Foreign Application Priority Data

May 24, 2021 (KR) ........................ 10-2021-0066489
May 16, 2022 (KR) ........................ 10-2022-0059314

(51) Int. Cl.

| | |
|---|---|
| ***C07F 5/02*** | (2006.01) |
| ***C09K 11/06*** | (2006.01) |
| ***H10K 50/11*** | (2023.01) |
| ***H10K 85/60*** | (2023.01) |
| ***H10K 101/10*** | (2023.01) |
| ***H10K 101/20*** | (2023.01) |

(52) U.S. Cl.
CPC .............. *C07F 5/027* (2013.01); *C09K 11/06* (2013.01); *H10K 50/11* (2023.02); *H10K 85/658* (2023.02); *C09K 2211/1022* (2013.01); *H10K 2101/10* (2023.02); *H10K 2101/20* (2023.02)

(58) Field of Classification Search
CPC .... H10K 85/658; H10K 85/322; H10K 50/11; H10K 2101/20; C07F 5/027; C07F 9/5325; C09K 2211/1018; C09K 11/06; C09K 2211/1055
See application file for complete search history.

(56) References Cited

U.S. PATENT DOCUMENTS

| | | | |
|---|---|---|---|
| 10,367,153 B2 | 7/2019 | Negishi et al. | |
| 2015/0236274 A1 | 8/2015 | Hatakeyama et al. | |
| 2019/0058124 A1 | 2/2019 | Hatakeyama et al. | |
| 2019/0207112 A1 | 7/2019 | Hatakeyama et al. | |
| 2020/0185632 A1 | 6/2020 | Kim et al. | |
| 2020/0190115 A1 | 6/2020 | Hatakeyama et al. | |
| 2021/0036238 A1 | 2/2021 | Kim et al. | |
| 2021/0167311 A1 | 6/2021 | Jeon et al. | |
| 2021/0292342 A1* | 9/2021 | Suzuki | C07F 5/027 |
| 2022/0093868 A1 | 3/2022 | Lee et al. | |

FOREIGN PATENT DOCUMENTS

| | | | |
|---|---|---|---|
| JP | 2020135575 | A | 8/2020 |
| JP | 2020136675 | A | 8/2020 |
| KR | 20160119683 | A | 10/2016 |
| KR | 20180108604 | A | 10/2018 |
| KR | 20180134850 | A | 12/2018 |
| KR | 20200006965 | A | 1/2020 |
| KR | 20200021423 | A | 2/2020 |
| KR | 20200071313 | A | 6/2020 |
| KR | 20210067752 | A | 6/2021 |
| WO | 2015174010 | A1 | 11/2015 |
| WO | 2016129298 | A1 | 11/2017 |
| WO | 2018074167 | A1 | 4/2018 |
| WO | 2019009052 | A1 | 1/2019 |
| WO | 2019056133 | A1 | 3/2019 |
| WO | 2020075760 | A1 | 4/2020 |

OTHER PUBLICATIONS

Zhang et al., "Extremely condensing triplet states of DPEPO-type hosts through constitutional isomerization for high-efficiency deep-blue thermally activated delayed fluorescence diodes" Chemical Science (2016) vol. 7, pp. 2870-2882. (Year: 2016).*
Chan et al., "Stable pure-blue hyperfluorescence organic light-emitting diodes with high-efficiency and narrow emission." Nature Photonics (2021) vol. 15, pp. 203-205. (Year: 2021).*
Kim, Jong Uk, et al., "Nanosecond-time-scale delayed fluorescence molecule for deep-blue OLEDs with small efficiency rolloff," Nature Communications, 11, 1765 (2020), 8 pages.
Kondo, Yasuhiro, et al., "Narrowband deep-blue organic light-emitting diode feature an organoborn-based emitter," Nature Photonics, vol. 13, 678-682 (2019).
Raikes, Bob "Where's the Display Market Headed?" Informationaldisplay.org, Sep.-Oct., pp. 34-38 (2020).
Ray, Kamal K., et al., Semiconductor Cocrystals Based on Boron: Generated Electrical Response with π-Rich Aromatic Molecules, Cryst. Growth Des. 2020, 20, 3-8.
Wada, Yoshimasa, et al., "Organic light emitters exhibiting very fast reverse intersystem crossing," Nature Photonics, vol. 14, 643-649 (2020), 8 pages.
Winterfeld, Kim A., et al., "Subphythalocyanines Axially Substituted with a Tetracyanobuta-1,3-diene-Aniline Moiety: Synthesis, Structure, and Physicochemical Properties," J. Am. Chem. Soc. 2017, 139, 15, pp. 5520-5529.
Winterfeld, Kim A., et al., "Supporting Information for Subphythalocyanines Axially Substituted with a Tetracyanobuta-1,3-diene-Aniline Moiety: Synthesis, Structure, and Physicochemical Properties," J. Am. Chem. Soc. 2017, 139, 15, pp. 5520-5529.

(Continued)

*Primary Examiner* — Dylan C Kershner
(74) *Attorney, Agent, or Firm* — CANTOR COLBURN LLP

(57) ABSTRACT

Provided are a film including a coordination compound and a light-emitting device including the film, wherein the coordination compound has a novel structure in which a ligand including an electron donor atom is coordinated to a boron atom in a heterocyclic compound.

19 Claims, 10 Drawing Sheets

(56) References Cited

OTHER PUBLICATIONS

Young, Ross "The Outlook for OLED Remains Bright," informationdisplay.org, May-Jun., 41-45 (2020).
English Abstract of JP 2020-136675.
Office Action dated Jan. 23, 2026, issued in corresponding KR Patent Application No. 10-2022-0059314, with English translation, 15 pp.

* cited by examiner

EXAMPLE 2

FILM AND LIGHT-EMITTING DEVICE INCLUDING THE SAME

CROSS-REFERENCE TO RELATED APPLICATION

This application claims priority under 35 U.S.C. § 119 to Korean Patent Application Nos. 10-2021-0066489, filed on May 24, 2021, and 10-2022-0059314, filed on May 16, 2022, in the Korean Intellectual Property Office, the contents of which are incorporated by reference herein in their entirety.

BACKGROUND

1. Field

The present disclosure relates to a film including a novel coordination compound and a light-emitting device including the film.

2. Description of the Related Art

Light-emitting devices, for example, organic light-emitting devices, are self-emissive devices that, as compared with devices of the related art, have wide viewing angles, high contrast ratios, short response times, and excellent characteristics in terms of luminance, driving voltage, and response speed, and produce full-color images.

In an example, an organic light-emitting device includes an anode, a cathode, and an organic layer that is arranged between the anode and the cathode and includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

Provided are a film including a coordination compound and a light-emitting device, for example, an organic light-emitting device, including the film.

Additional aspects will be set forth in part in the description which follows and, in part, will be apparent from the description, or may be learned by practice of the presented embodiments of the disclosure.

According to an aspect of an embodiment, a film includes a coordination compound represented by $A_1(L_1)_{n1}$, wherein $A_1$ is a heterocyclic compound represented by Formula 1-1 and ligand $L_1$ in the number n1 includes an electron donor atom:

Formula 1-1

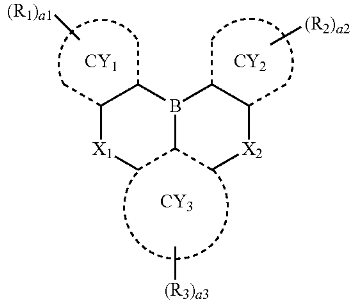

wherein, in Formula 1-1, ligand $L_1$ is bonded to boron (B) which is a central element in Formula 1-1, a bond between the boron (B) of $A_1$ and ligand $L_1$ is a coordinate bond, n1 represents the number of ligand(s) $L_1$ and is 1 or 2, ring $CY_1$ to ring $CY_3$ are each independently a $C_5$-$C_{30}$ carbocyclic group or a $C_1$-$C_{30}$ heterocyclic group, $X_1$ is O, S, Se, $N(R_4)$, $C(R_4)(R_5)$, $Ge(R_4)(R_5)$, or $Si(R_4)(R_5)$, $X_2$ is O, S, Se, $N(R_6)$, $C(R_6)(R_7)$, $Ge(R_4)(R_5)$, or $Si(R_6)(R_7)$, $R_1$ to $R_7$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_6$ heteroaryl group, a substituted or unsubstituted $C_1$-$C_{60}$ heteroarylalkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, a1 to a3 are each independently an integer from 1 to 10, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroarylalkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), —B($Q_{16}$)($Q_{17}$), —P(=O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one deuterium, —F, —Cl, —Br, —I,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$)—B($Q_{26}$)($Q_{27}$), —P(=O)($Q_{28}$)($Q_{29}$), or a combination thereof; or —Si($Q_{31}$)($Q_{32}$)($Q_{33}$), —N($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

According to an aspect of another embodiment, a light-emitting device includes: a first electrode; a second electrode; and an organic layer arranged between the first electrode and the second electrode and including an emission layer, wherein the emission layer includes the film.

According to an aspect of another embodiment, an electronic apparatus includes the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
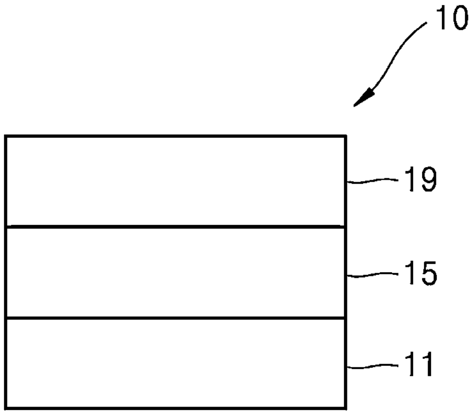
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

A film according to an embodiment of the present disclosure may include a coordination compound represented by $A_1(L_1)_{n1}$, wherein $A_1$ is a heterocyclic compound $A_1$ represented by Formula 1-1 and ligand $L_1$ includes an electron donor atom:

Formula 1-1

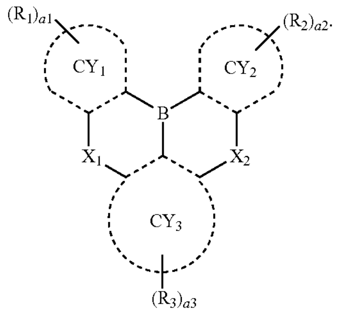

Ligand $L_1$ may be bonded to boron (B) which is a central element of the heterocyclic compound $A_1$ represented by Formula 1-1. In an embodiment, a bond between a central atom of the heterocyclic compound represented by Formula 1-1 and ligand $L_1$ may be a coordinate bond.

Ligand $L_1$ may include an electron donor atom, and in this regard, the term "electron donor atom" refers to an atom having at least one unshared electron pair capable of participating in bonding to donate electrons to a vacant orbital.

In an embodiment, the ligand may be a monodentate ligand, a bidentate ligand, or a tridentate ligand. For example, the ligand may be a monodentate ligand or a bidentate ligand. In this regard, the term "monodentate ligand" refers to a ligand including one unshared electron pair capable of participating in bonding, the term "bidentate ligand" refers to a ligand including two unshared electron pairs capable of participating in bonding, and the term "tridentate ligand" refers to a ligand including three unshared electron pairs capable of participating in bonding.

In an embodiment, ligand $L_1$ may be a phosphine group, a halogen group, a cyano group, a hydroxyl group, a thiol group, an alkoxy group, an imine group, or an organic group including one or more of these groups, but embodiments of the present disclosure are not limited thereto.

In an embodiment, a B atom in Formula 1-1 may be coordinated with the electron donor atom of ligand $L_1$, and the electron donor atom of ligand $L_1$ may be oxygen of a phosphine group, a halogen group, a carbon of a cyano group, or an oxygen of a hydroxyl group.

In an embodiment, ligand $L_1$ may be bonded to a B atom in a group represented by Formula 1-1 in an axial direction with respect to a plane formed by ring $CY_1$, ring $CY_2$ and ring $CY_3$.

The electron donor atom of ligand $L_1$ may include an unshared electron pair capable of participating in bonding, and the unshared electron pair may provide electrons to an empty P-orbital of the B atom in Formula 1-1. Since the heterocyclic compound represented by Formula 1-1 has a planar structure while the P-orbital of the B atom is oriented in an axial direction of the planar structure of Formula 1-1, the electron donor atom may approach the P-orbital in the axial direction to form a coordinate bond therewith.

n1 in Formula 1-1 may be 1 or 2.

Ring $CY_1$ to ring $CY_3$ in Formula 1-1 may each independently be a $C_5$-$C_{30}$ carbocyclic group or a $C_1$-$C_{30}$ heterocyclic group.

In an embodiment, ring $CY_1$, ring $CY_2$, and ring $CY_3$ may each independently be a benzene group, a naphthalene group, a fluorene group, a pyridine group, a pyrimidine group, a pyrazine group, a quinoline group, an isoquinoline group, a quinazoline group, a quinoxaline group, a phthalazine group, a carbazole group, an azacarbazole group, a dibenzofuran group, a dibenzothiophene group, a dibenzoselenophene group, a dibenzosilole group, a dibenzoborole group, an azadibenzofuran group, an azadibenzothiophene group, an azadibenzoselenophene group, an azadibenzosilole group, an azadibenzoborole group, or a group represented by Formula a:

Formula a

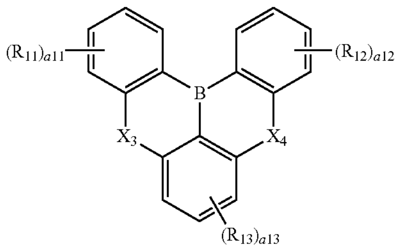

wherein, in Formula a, $X_3$ may be O, S, Se, $N(R_{14})$, $C(R_{14})(R_{15})$, $Ge(R_{14})(R_{15})$, or $Si(R_{14})(R_{15})$, $X_4$ may be O, S, Se, $N(R_{16})$, $C(R_{16})(R_{17})$, $Ge(R_{16})(R_{17})$, or $Si(R_{16})(R_{17})$, $R_{11}$ to $R_{17}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_6$ heteroaryl group, a substituted or unsubstituted $C_1$-$C_{60}$ heteroarylalkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, a11 and a12 may each independently be an integer from 1 to 4, and a13 may be an integer from 1 to 3.

$R_{11}$ to $R_{17}$ in Formula a are respectively the same as described in connection with $R_1$ to $R_7$.

$X_3$ and $X_4$ in Formula a are respectively the same as described in connection with $X_1$ and $X_4$.

In Formula 1-1, $X_1$ may be O, S, Se, $N(R_4)$, $C(R_4)(R_5)$, $Ge(R_4)(R_5)$, or $Si(R_4)(R_5)$, and $X_2$ may be O, S, Se, $N(R_6)$, $C(R_6)(R_7)$, $Ge(R_4)(R_5)$, or $Si(R_6)(R_7)$.

In an embodiment, $X_1$ may be O, S, $N(R_4)$, $C(R_4)(R_5)$, or $Si(R_4)(R_5)$, and $X_2$ may be O, S, $N(R_4)$, $C(R_4)(R_5)$, or $Si(R_4)(R_5)$, but embodiments of the present disclosure are not limited thereto. For example, $X_1$ may be O, S, or $N(R_4)$, and $X_2$ may be O, S, or $N(R_4)$.

In an embodiment, when $X_1$ is $N(R_4)$, $R_4$ may be a phenyl group or a phenyl group that is substituted with at least one of deuterium, a $C_1$-$C_{20}$ alkyl group, a $C_1$-$C_{20}$ alkoxy group, or a combination thereof, and when $X_2$ is $N(R_5)$, $R_5$ may be a phenyl group or a phenyl group that is substituted with at least one of deuterium, a $C_1$-$C_{20}$ alkyl group, a $C_1$-$C_{20}$ alkoxy group, or a combination thereof.

In an embodiment, $X_1$ and $X_2$ may be identical to each other.

$R_1$ to $R_7$ in Formula 1-1 may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroarylalkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q)$.

In an embodiment, $R_1$ to $R_7$ may each independently be:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, or a combination thereof;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group; a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_6$-$C_{60}$ arylalkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —Si$(Q_{31})(Q_{32})(Q_{33})$, —N$(Q_{34})(Q_{35})$, —B$(Q_{36})(Q_{37})$, —P(=O)$(Q_{38})(Q_{39})$, or a combination thereof; or —N$(Q_1)(Q_2)$, —Si$(Q_3)(Q_4)(Q_5)$, —B$(Q_6)(Q_7)$, or —P(=O)$(Q_8)(Q_9)$, and $Q_1$ to $Q_9$ and $Q_{31}$ to $Q_{39}$ may each independently be hydrogen, deuterium, a $C_1$-$C_{20}$ alkyl group, a $C_1$-$C_{20}$ alkoxy group, a phenyl group, a biphenyl group, a phenyl group or a biphenyl group that are each substituted with at least one of deuterium, a $C_1$-$C_{20}$ alkyl group, and a $C_1$-$C_{20}$ alkoxy group, a pyridinyl group, a pyrimidinyl group, a pyrazinyl group, a pyridazinyl group, a carbazole group, a dibenzofuranyl group, a dibenzothiophenyl group, a dibenzosilolyl group, or a combination thereof.

For example, $R_1$ to $R_7$ may each independently be:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, an amino group, a phenyl group, or a combination thereof;

—N$(Q_1)(Q_2)$; or a group represented by one of Formulae 4-1 to 4-42:

4-1

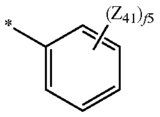

4-2

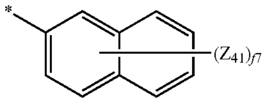

4-3

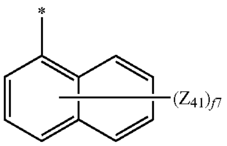

4-4

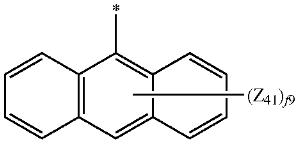

4-5

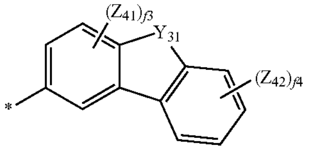

4-6

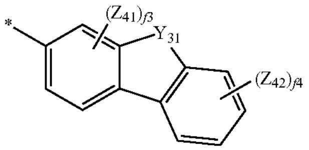

4-7

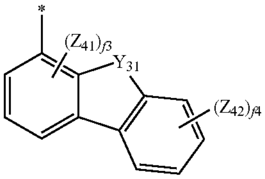

-continued
4-8
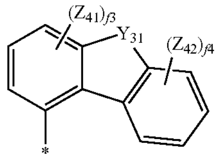
4-9
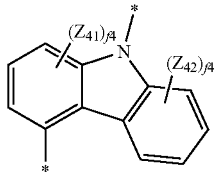
4-10
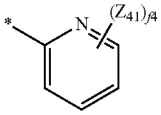
4-11
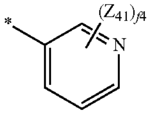
4-12
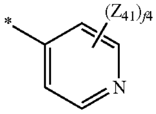
4-13
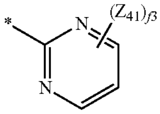
4-14
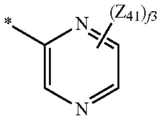
4-15
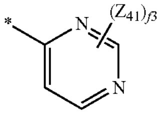
4-16
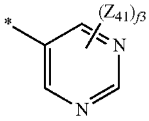
4-17
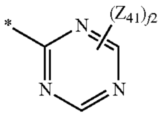
4-18
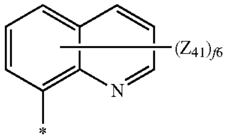
-continued
4-19
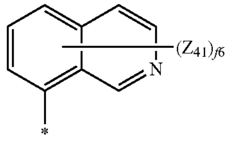
4-20
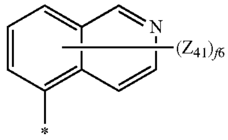
4-21
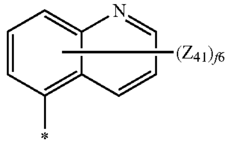
4-22
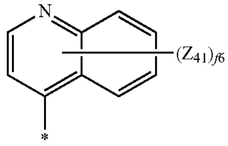
4-23
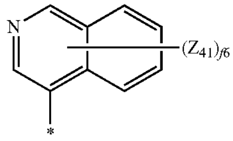
4-24
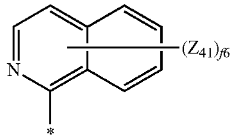
4-25
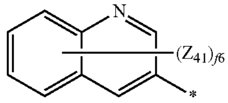
4-26
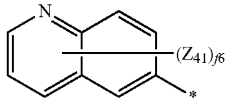
4-27
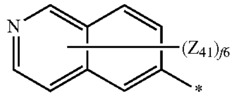
4-28
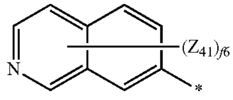
4-29
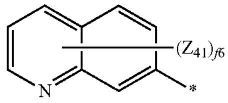
4-30
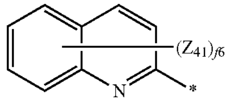

-continued 4-31

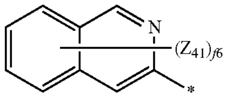

4-32

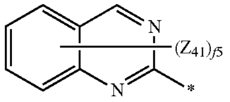

4-33

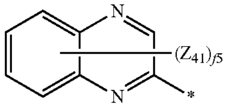

4-34

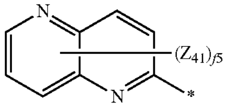

4-35

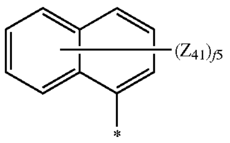

4-36

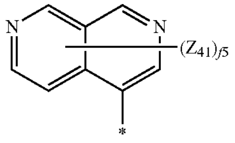

4-37

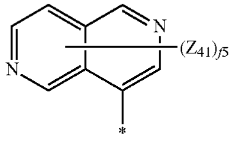

4-38

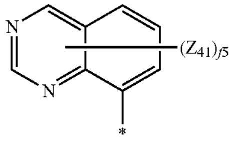

4-39

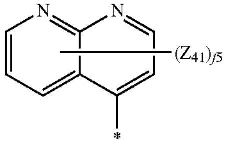

4-40

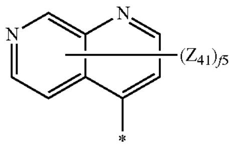

4-41

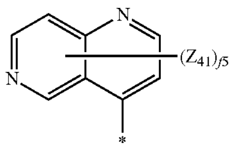

-continued 4-42

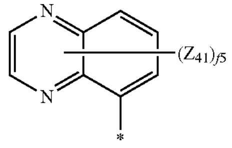

wherein, in Formulae 4-1 to 4-42, $Y_{31}$ may be O, S, $C(Z_{45})(Z_{46})$, $N(Z_{47})$, or $Si(Z_{48})(Z_{49})$, $Z_{41}$ to $Z_{49}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ arylalkyl group, a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group; or a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cumyl group, or a combination thereof, f3 may be an integer from 1 to 3, f4 may be an integer from 1 to 4, f5 may be an integer from 1 to 5, f6 may be an integer from 1 to 6, f7 may be an integer from 1 to 7, f9 may be an integer from 1 to 9, and

* indicates a binding site to a neighboring atom.

In an embodiment, at least one of $R_1$ to $R_3$ may be $—N(Q_1)(Q_2)$, and $Q_1$ and $Q_2$ may each independently be a phenyl group or a phenyl group that is substituted with at least one of deuterium, a $C_1$-$C_{20}$ alkyl group, a $C_1$-$C_{20}$ alkoxy group, or a combination thereof.

a1 to a3 in Formula 1-1 may each independently be an integer from 1 to 10. a1 indicates the number of $R_1$(s), wherein, when a1 is an integer of 2 or more, two or more of $R_1$(s) may be identical to or different from each other. a2 and a3 may be understood in the same manner as a1.

In an embodiment, Formula 1-1 may be a group represented by one of Formulae 2-1 to 2-7:

2-1

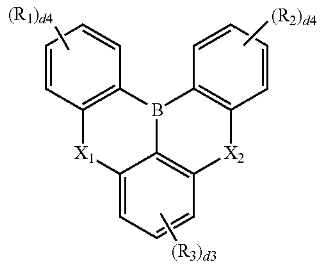

2-2

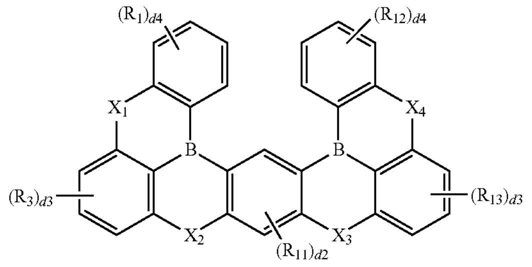

2-3

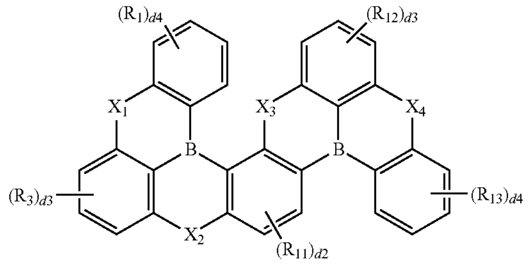

2-4

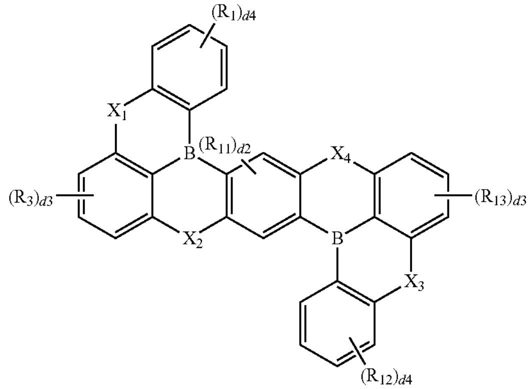

-continued 2-5

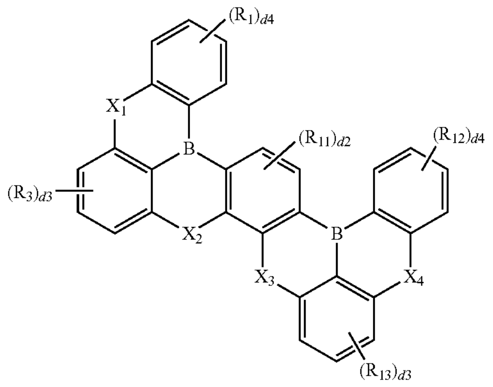

2-6

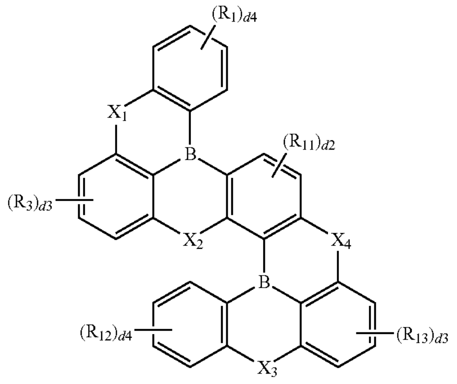

2-7

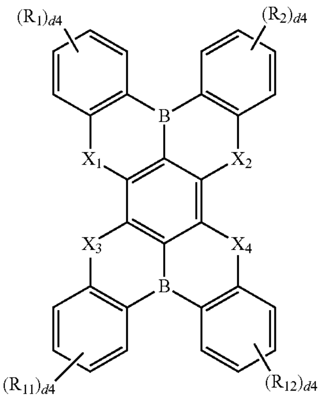

wherein, in Formulae 2-1 to 2-7, $R_1$ to $R_3$, $R_{11}$ to $R_{13}$, and $X_1$ to $X_4$ are respectively the same as those described herein, d2 may be an integer from 1 to 2, d3 may be an integer from 1 to 3, and d4 may be an integer from 1 to 4.

In an embodiment, when Formula 1-1 is Formula 2-1, in Formula 1-1, n1 may be 1, and ligand $L_1$ may be a monodentate ligand.

In an embodiment, when Formula 1-1 is Formulae 2-2 to 2-7, in Formula 1-1, n1 may be 1 or 2, and ligand $L_1$ may include one bidentate ligand or two monodentate ligands.

In an embodiment, a $k_{RISC}$ value of the coordination compound of the heterocyclic compound and the ligand including the electron donor atom in the film may be $3\times10^5$/s or more. In this regard, the $k_{RISC}$ value, which is measured and calculated by the method described in Examples provided below, is a value representing the rate at which excited triplet ($T_1$) energy in a molecule is converted into excited singlet ($S_1$) energy. A large $k_{RISc}$ value indicates that the number of excitons staying in the Ti energy level, which affects device roll-off, is small, suggesting that it is easy to manufacture a device having high efficiency and long lifespan characteristics.

In an embodiment, the coordination compound of the heterocyclic compound and the ligand including the electron donor atom in the film may be one of Compounds 1 to 5:

1

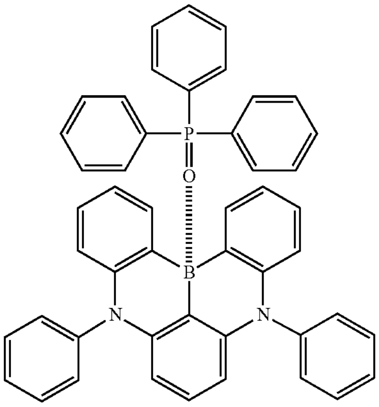

2

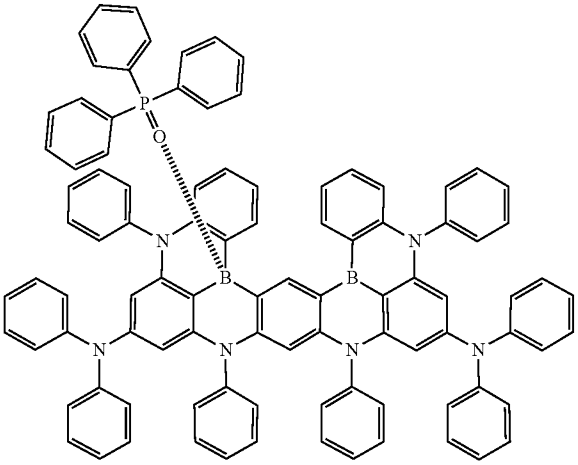

3

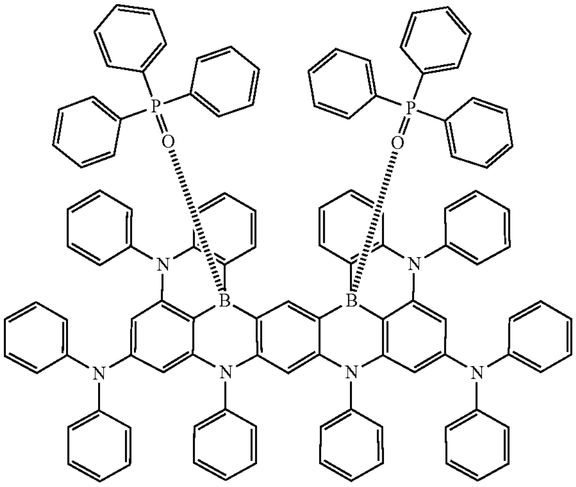

-continued

4

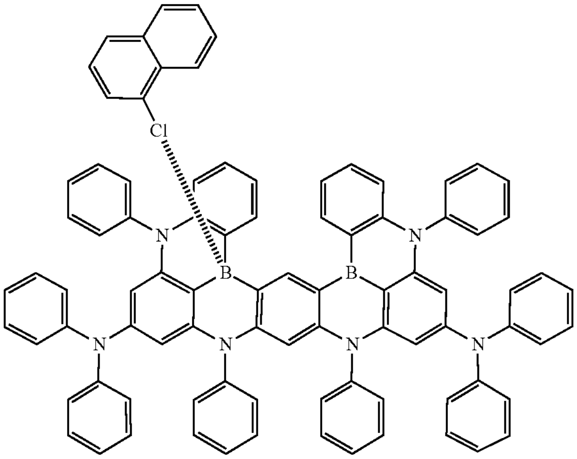

5

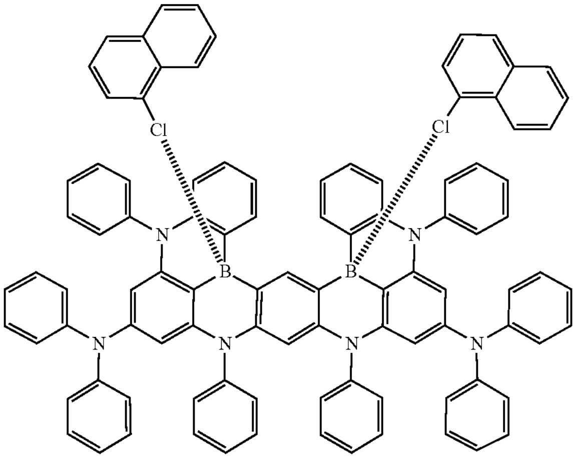

In the coordination compound included in the film and including the heterocyclic compound and the ligand including the electron donor atom according to an embodiment of the present disclosure, since ligand $L_1$ is coordinated to a boron atom in the heterocyclic compound represented by Formula 1-1 and having a planar structure rather than a curved structure, improved $k_{RISC}$, $\tau_f$, and $\tau_{TADF}$ values may be obtained, and low $k_{IC}$ and $k_{ISC}$ values may be obtained. Accordingly, the coordination compound may be used in manufacturing a light-emitting device having high efficiency and long lifespan characteristics.

Due to ligand $L_1$ pulling the heterocyclic compound having the planar structure in an axial direction, the coordination compound may exhibit an effect of accelerating $k_{RISC}$ without a decrease in color purity, thereby obtaining high efficiency and long lifespan characteristics.

The film including the heterocyclic compound represented by Formula 1-1 and the ligand including the electron donor atom may be suitable for use in an organic layer of an organic light-emitting device, for example, in an emission layer of the organic layer.

Another aspect of the present disclosure provides a light-emitting device including: a first electrode; a second electrode; and an organic layer arranged between the first electrode and the second electrode and including an emission layer, wherein the emission layer includes the film.

The light-emitting device may have high efficiency, a long lifespan, and a low roll-off ratio by having the emission layer including the film as described above.

The film may be used as an emission layer. The film may further include a host, and an amount of the host included in the film may be greater than 50 wt % based on a total weight of the film. For example, the coordination compound of the heterocyclic compound and the ligand including the electron donor atom in the film may have a lower wt % than that of the host. The emission layer may emit blue light, for example, blue light having a maximum emission wavelength of about 400 nm or more and about 500 nm or less (for example, about 440 nm or more and about 490 nm or less).

The first electrode may be an anode, which is a hole injection electrode, and the second electrode may be a cathode, which is an electron injection electrode. In one or more embodiments, the first electrode may be a cathode, which is an electron injection electrode, and the second electrode may be an anode, which is a hole injection electrode.

For example, in the light-emitting device, the first electrode may be an anode, the second electrode may be a cathode, the organic layer may further include a hole transport region arranged between the first electrode and the emission layer and an electron transport region arranged between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, a buffer layer, or any combination thereof.

The term "organic layer" as used herein refers to a single layer and/or a plurality of layers arranged between the first electrode and the second electrode of the light-emitting device. The "organic layer" may include, in addition to an organic compound, an organometallic complex including metal.

In an embodiment, the emission layer may emit fluorescent light, and the coordination compound of the heterocyclic compound represented by Formula 1-1 and the ligand including the electron donor atom in the film may be a fluorescent emitter. The emission layer emitting the fluorescent light is clearly distinguished from an emission layer of the related art that emits phosphorescent light.

In an embodiment, the emission layer may further include a sensitizer satisfying Equation 1, and the amount of the host may be greater than the sum of amounts of the sensitizer and the coordination compound:

$$\Delta E_{ST} \leq 0.3 eV \qquad \text{Equation 1}$$

wherein, $\Delta E_{ST}$ indicates a difference between lowest excited $S_1$ energy and lowest excited $T_1$ energy of the sensitizer.

The $T_1$ energy level and the $S_1$ energy level may be evaluated using the density functional theory (DFT) method of the Gaussian program, which is structure-optimized at the B3LYP/6-31G(d,p) level.

When the emission layer simultaneously includes the sensitizer and the coordination compound, the excited $T_1$ energy level and the excited $S_1$ energy level of the sensitizer may have an energy relationship suitable for transferring excited $T_1$ energy and excited $S_1$ energy of the host to excited $T_1$ energy and excited $S_1$ energy of the coordination compound.

For example, when the emission layer includes a host, a sensitizer, and the coordination compound, the host, the sensitizer, and the coordination compound may further satisfy Condition 1:

$$T_1(H) \geq T_1(S) \geq S_1(PC) \qquad \text{Condition 1}$$

wherein, in Condition 1, $T_1(H)$ indicates a lowest excited $T_1$ energy level of the host, and $S_1(PC)$ indicates a lowest excited $S_1$ energy level of the coordination compound, and $T_1(S)$ indicates a lowest excited $T_1$ energy level of the sensitizer.

In an embodiment, the emission layer may consist of the host, the sensitizer, and the coordination compound.

FIG. 1 is a schematic cross-sectional view of an organic light-emitting device 10 according to an exemplary embodiment. Hereinafter, the structure and manufacturing method of the organic light-emitting device 10 according to an embodiment of the present disclosure will be described in connection with FIG. 1. The organic light-emitting device 10 may include a first electrode 11, an organic layer 15, and a second electrode 19, which are sequentially stacked in this stated order.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be produced by depositing or sputtering, onto the substrate, a material for forming the first electrode 11. The first electrode 11 may be an anode. The material for forming the first electrode 11 may be a material with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. For example, the first electrode 11 may have a three-layered structure of ITO/Ag/ITO, but the structure of the first electrode 11 is not limited thereto.

The organic layer 15 may be arranged on the first electrode 11.

The organic layer 15 may include a hole transport region, an emission layer, and an electron transport region.

The hole transport region may be arranged between the first electrode 11 and the emission layer.

The hole transport region may include at least one of a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec. However, the deposition conditions are not limited thereto.

When the hole injection layer is formed by spin coating, the coating conditions may vary according to a material that is used to form the hole injection layer, and the structure and thermal characteristics of the hole injection layer. For example, the coating conditions may include a coating speed in a range of about 2,000 rpm to about 5,000 rpm and a heat treatment temperature for removing a solvent after coating in a range of about 80° C. to about 200° C. However, the coating conditions are not limited thereto.

Conditions for forming the hole transport layer and the electron blocking layer may be the same as the conditions for forming the hole injection layer.

The hole transport region may include at least one m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

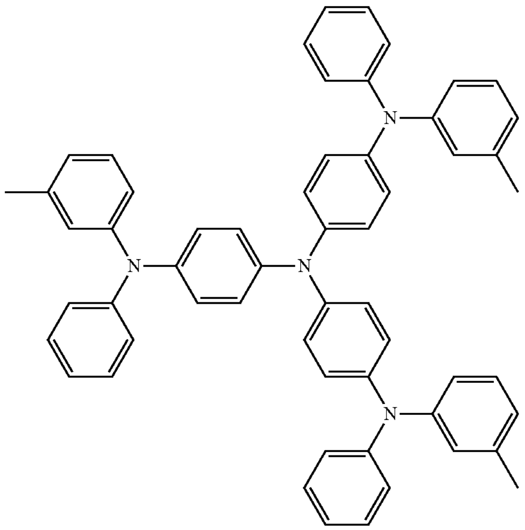

m-MTDATA

-continued

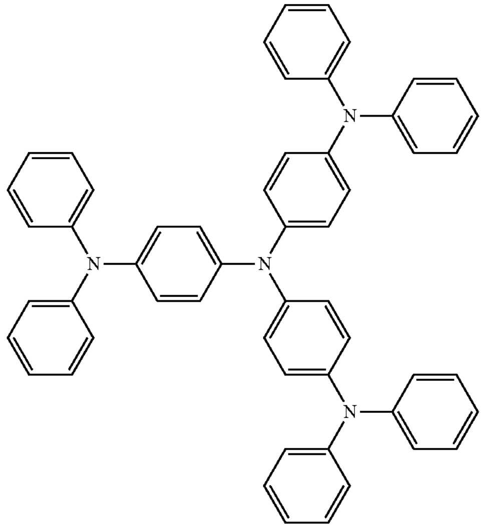

TDATA

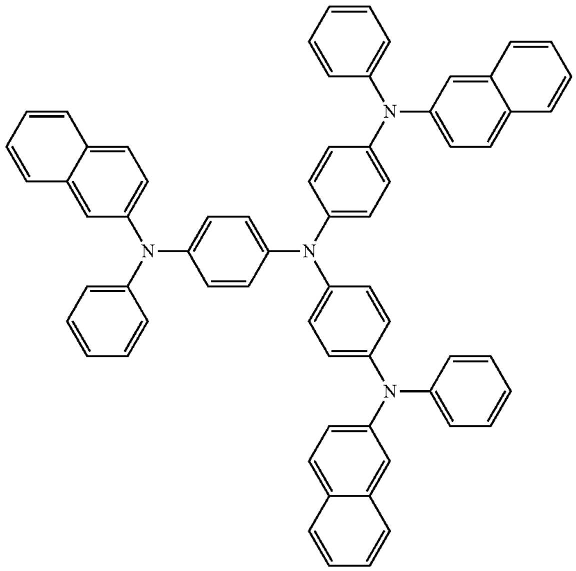

2-TNATA

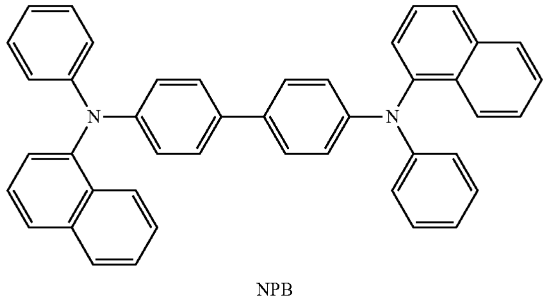

NPB

-continued

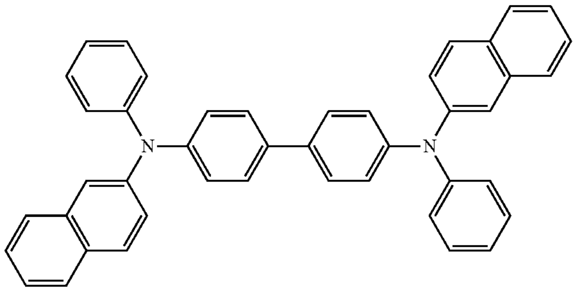

β-NPB

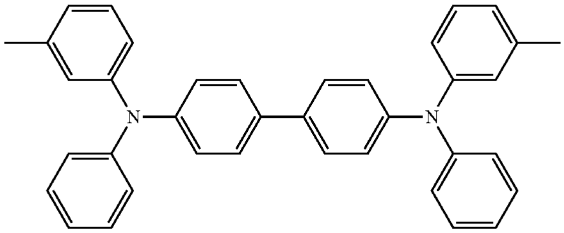

TPD

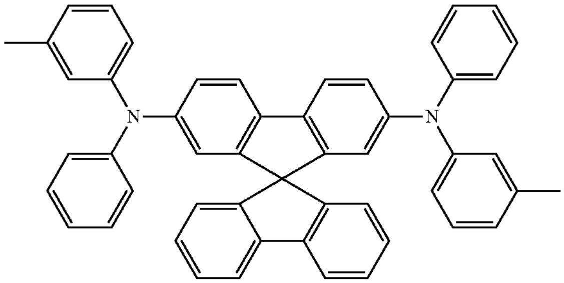

Spiro-TPD

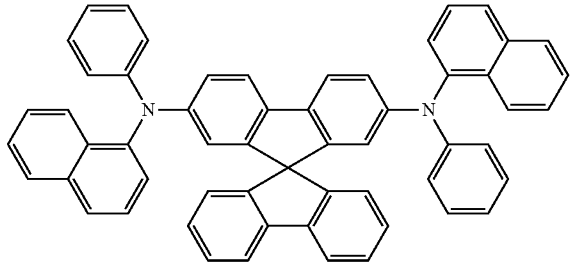

Spiro-NPB

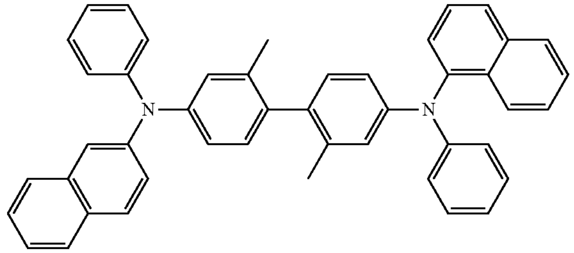

methylated NPB

-continued

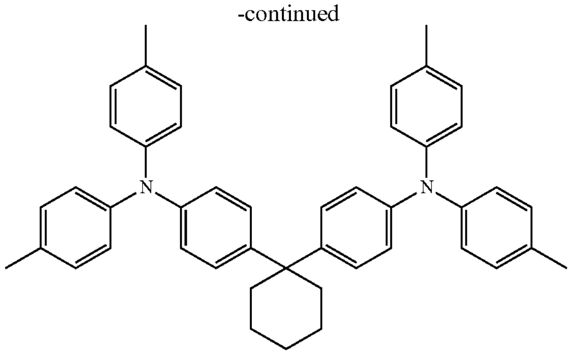

TAPC

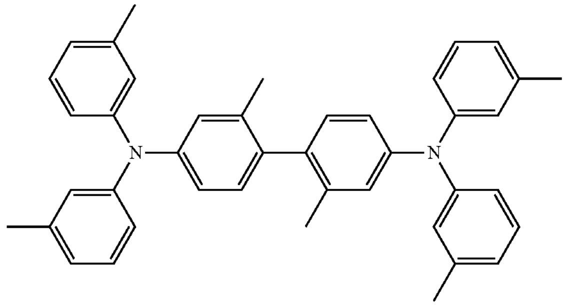

HMTPD

Formula 201

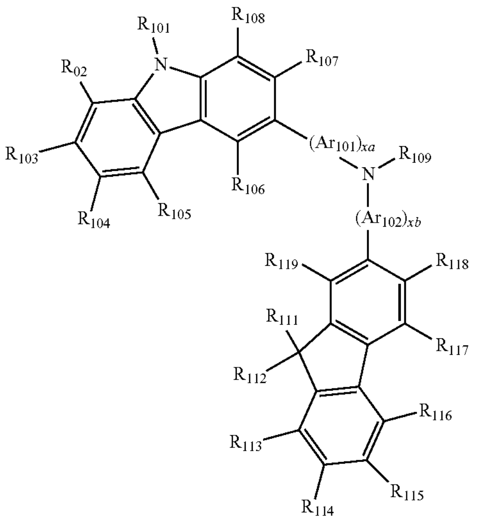

Formula 202

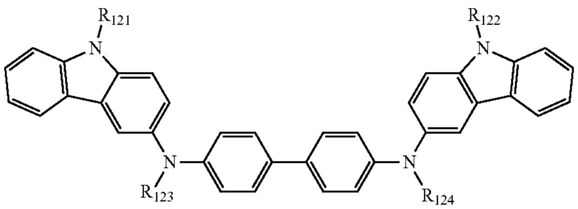

wherein, in Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.) or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof, but embodiments of the present disclosure are not limited thereto.

$R_{109}$ in Formula 201 may be:

a phenyl group, a naphthyl group, an anthracenyl group, or a pyridinyl group; or a phenyl group, a naphthyl group, an anthracenyl group, or a pyridinyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In an embodiment, the compound represented by Formula 201 may be represented by Formula 201A, but embodiments of the present disclosure are not limited thereto:

Formula 201A

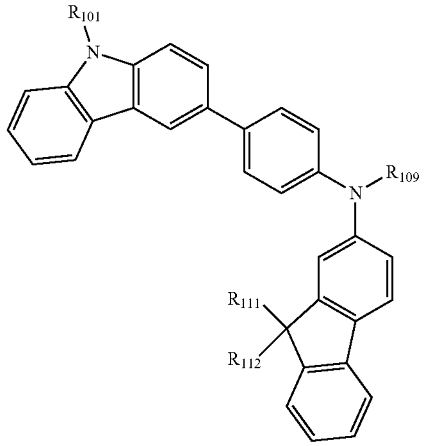

wherein, in Formula 201A, $R_{101}$, $R_{111}$, $R_{112}$, and $R_{109}$ are respectively the same as those described above.

For example, the compound represented by Formula 201, and the compound represented by Formula 202 may include Compounds HT1 to HT20, but embodiments of the present disclosure are not limited thereto:

HT1

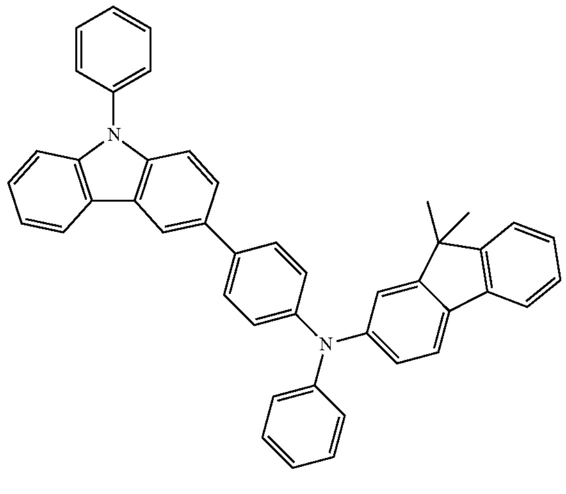

-continued
HT2
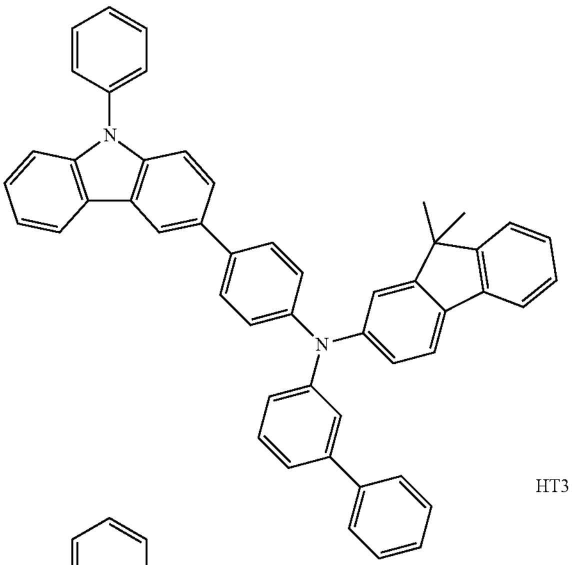
HT3
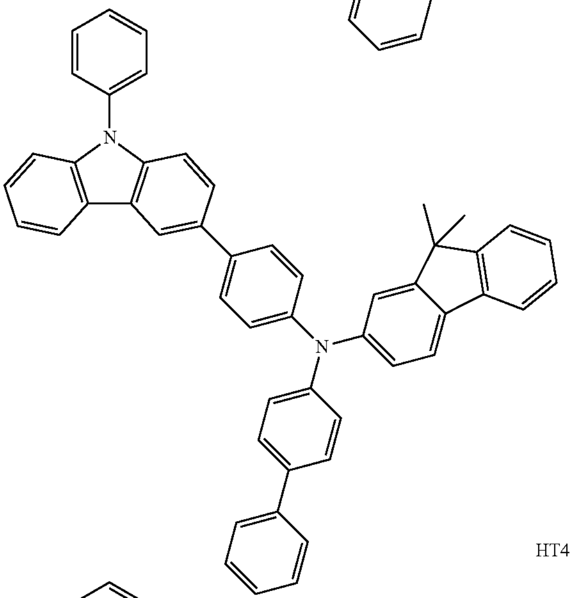
HT4
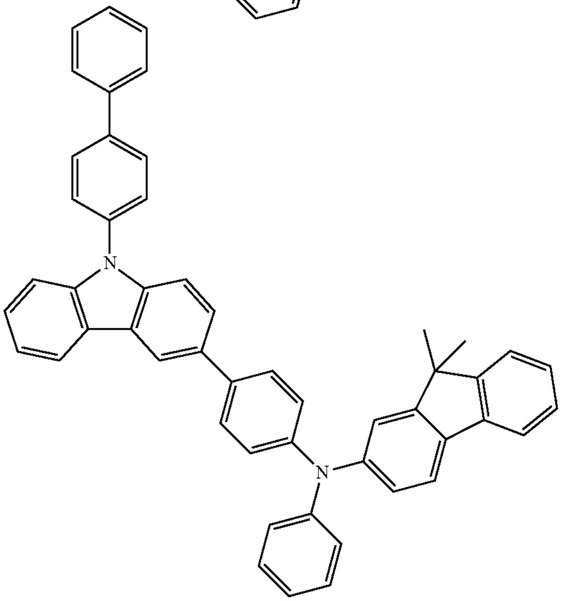
-continued
HT5
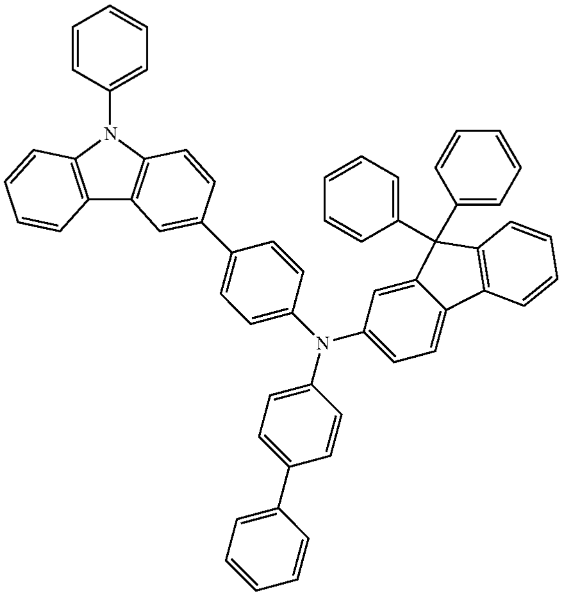
HT6
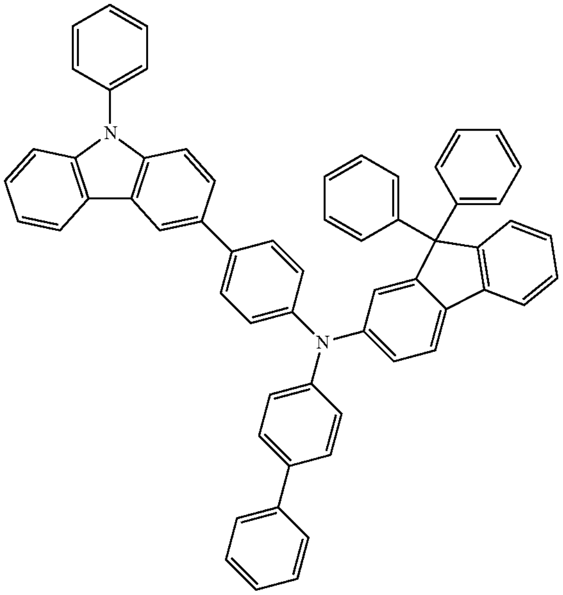

-continued
HT7
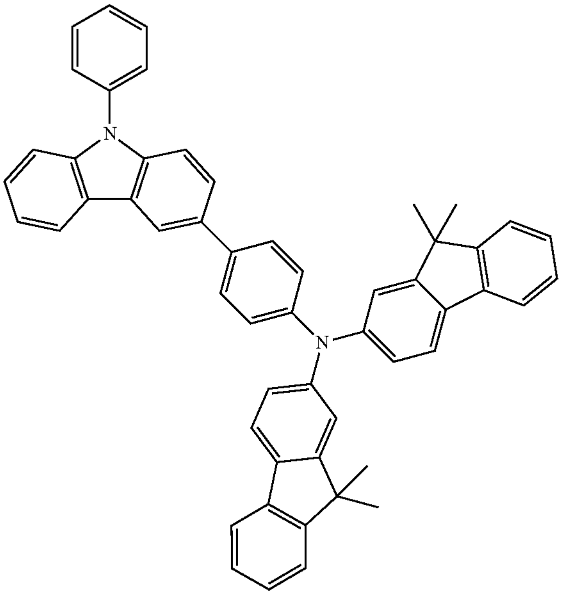
HT8
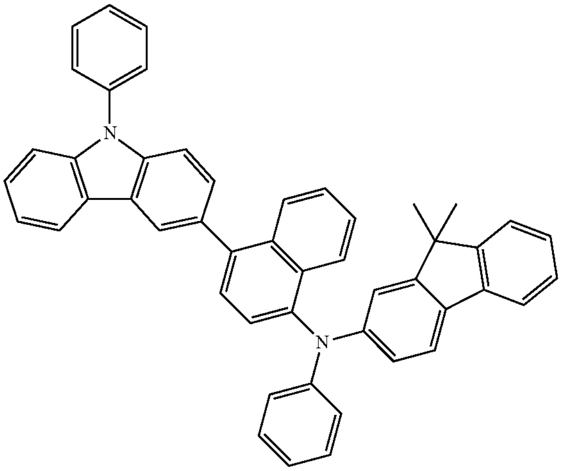
HT9
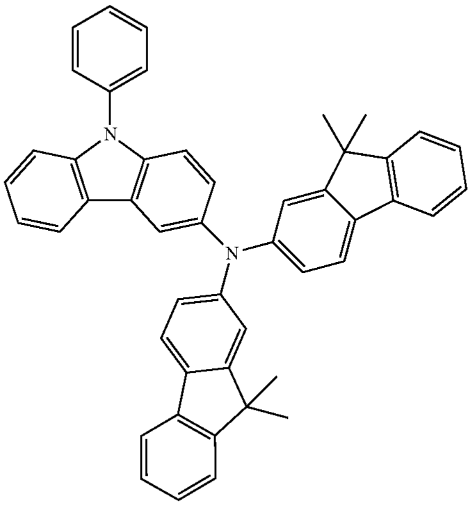
-continued
HT10
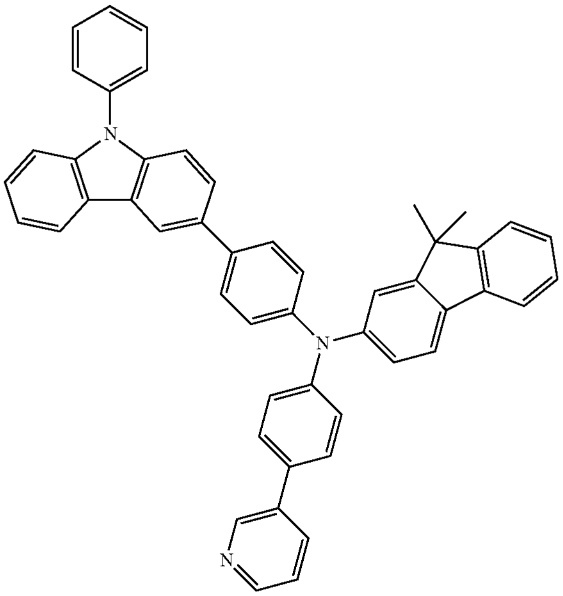
HT11
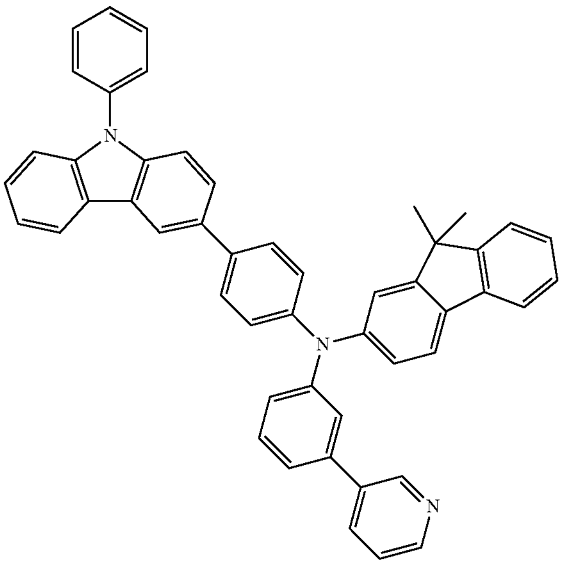

-continued
HT12
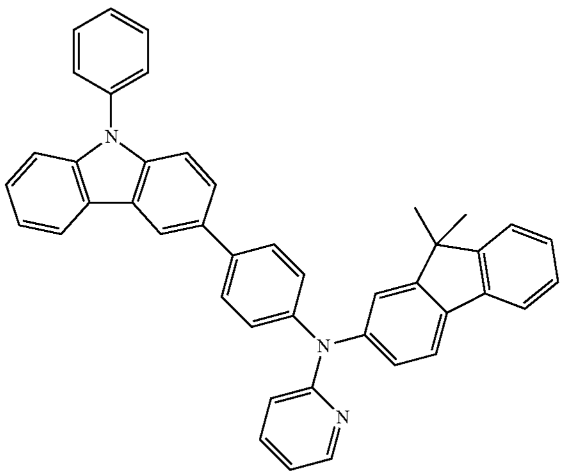
HT13
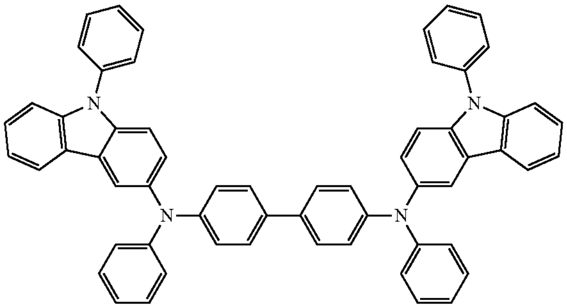
HT14
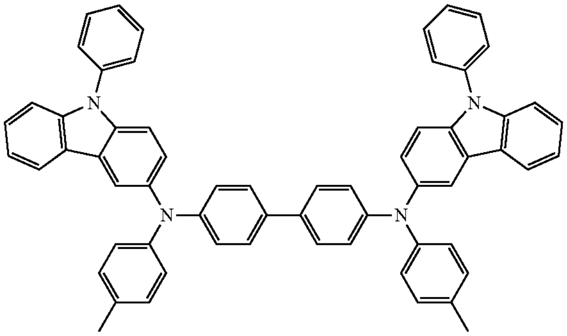
HT15
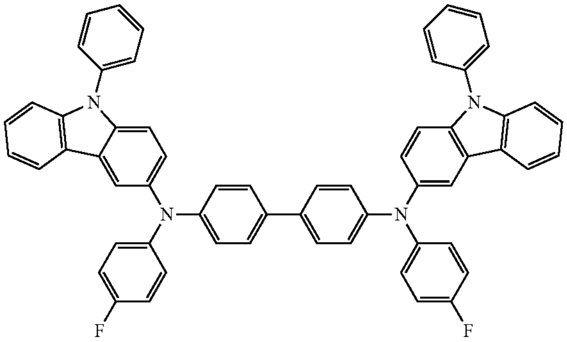
-continued
HT16
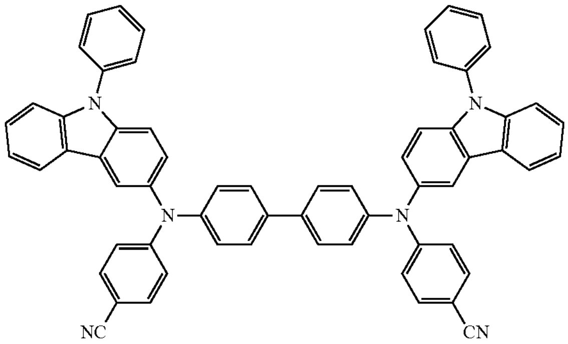
HT17
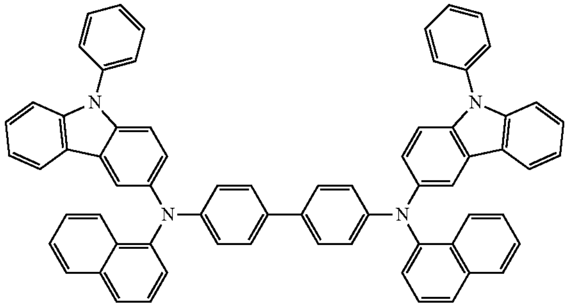
HT18
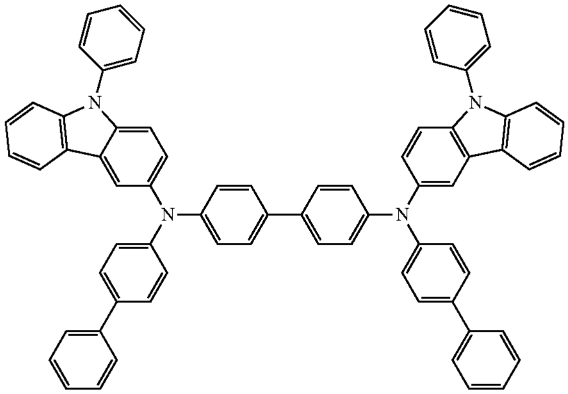
HT19
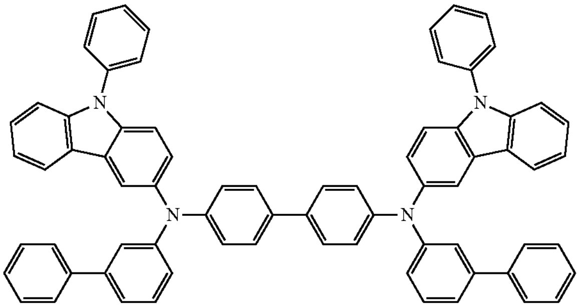

-continued

HT20

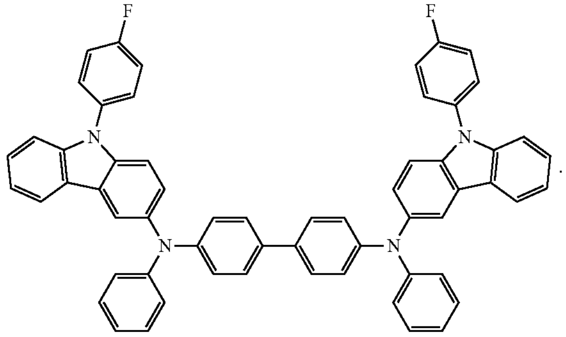

A thickness of the hole transport region may be in a range of about 100 Å to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within the ranges described above, satisfactory hole transporting characteristics may be obtained without a substantial increase in driving voltage.

The hole transport region may further include, in addition to the materials described above, a charge-generation material for improving conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2, but are not limited thereto:

HT-D1

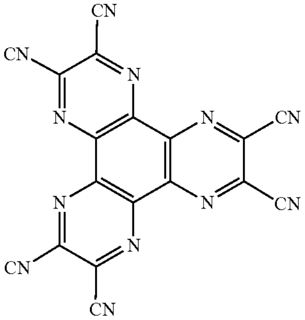

-continued

F4-TCNQ

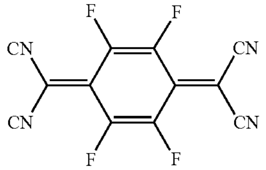

HT-D2

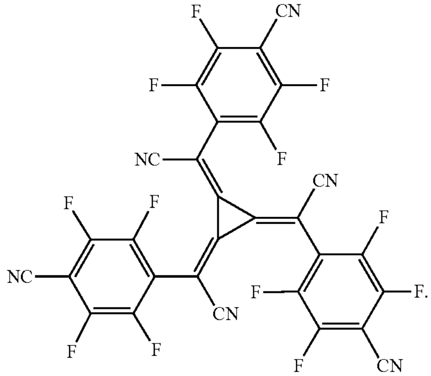

The hole transport region may further include a buffer layer.

The buffer layer may compensate for an optical resonance distance according to a wavelength of light emitted from the emission layer, and thus, efficiency of a formed organic light-emitting device may be improved.

The hole transport region may further include an electron blocking layer. The electron blocking layer may include any material available in the art, for example, mCP, but embodiments of the present disclosure are not limited thereto:

mCP

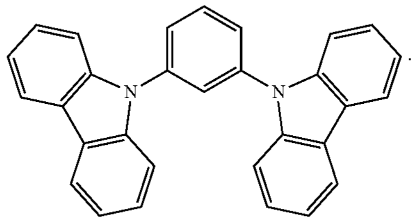

The emission layer may be formed on the hole transport region by using one or more suitable methods, such as vacuum deposition, spin coating, casting, and LB deposition. When the emission layer is formed by vacuum deposition or spin coating, the deposition or coating conditions may be similar to those applied in forming the hole injection layer, though the deposition or coating conditions may vary according to a material that is used to form the emission layer.

When the organic light-emitting device 10 is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include the film as described above, the film may include a host and a dopant, and the dopant may include a coordination compound of a heterocyclic compound represented by Formula 1-1 and a ligand including an electron donor atom, wherein the coordination compound is the same as described herein.

In an embodiment, the emission layer may be manufactured by co-depositing the coordination compound of the heterocyclic compound represented by Formula 1-1 and the ligand including the electron donor atom, and a host compound, or by a solution process in which a solution including the coordination compound and the host compound is applied to a substrate.

For example, the emission layer may be manufactured by a solution process that includes applying a source material solution on a substrate, and in this regard, the source material solution used in the solution process may include the heterocyclic compound represented by Formula 1-1 and ligand $L_1$ including the electron donor atom in a molar ratio of about 1:0.5 to 4.0.

In an embodiment, the source material solution may further include a host compound as described herein.

In an embodiment, the source material solution may be prepared by simultaneously adding, to a solvent, a host compound, the heterocyclic compound represented by Formula 1-1, and ligand $L_1$ including the electron donor atom and then mixing the same, or may be prepared by pre-mixing the heterocyclic compound represented by Formula 1-1 and ligand $L_1$ including the electron donor atom in a solvent and then adding the host compound thereto. In this regard, the solvent is not particularly limited as long as the solvent is capable of simultaneously dispersing the heterocyclic compound represented by Formula 1-1 and ligand $L_1$ including the electron donor atom. For example, toluene may be used as the solvent.

In an embodiment, the source material solution obtained by mixing the heterocyclic compound represented by Formula 1-1 and ligand $L_1$ including the electron donor atom in the solvent at a temperature of about 50° C. to about 70° C. for about 1 hour to about 3 hours may further include a host compound as described below.

In an embodiment, the substrate including the source material solution may undergo a drying process to form an emission layer thin-film.

The host may include at least one of TPBi, TBADN, ADN (also referred to as "DNA"), CBP, CDBP, TCP, mCP, one of Compounds H50 to H52, or a combination thereof:

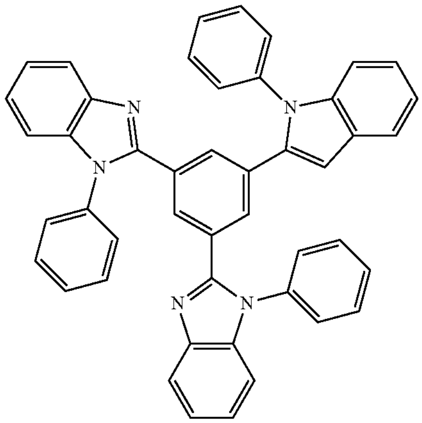

TPBI

-continued

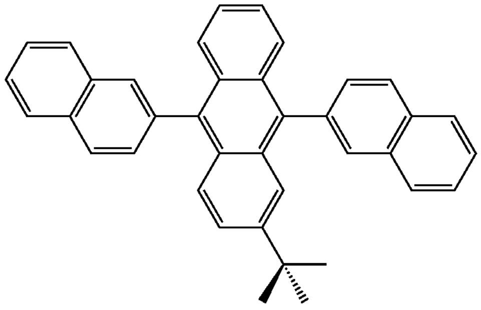

TBADN

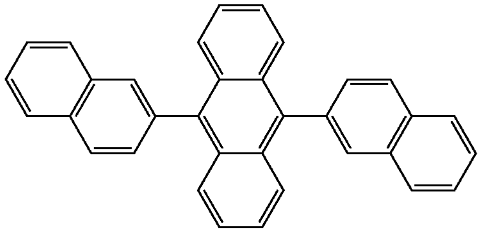

ADN

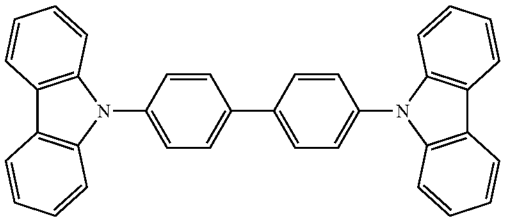

CBP

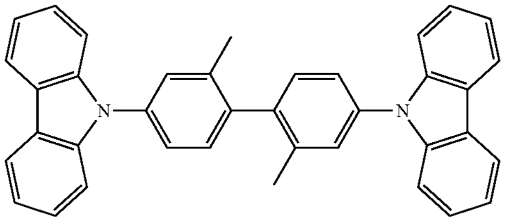

CDBP

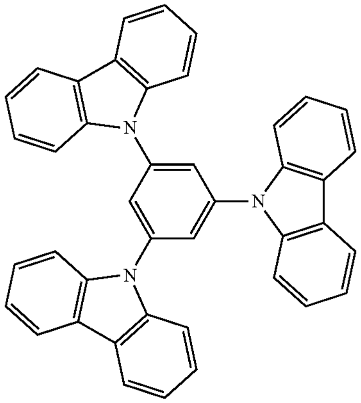

TCP

-continued

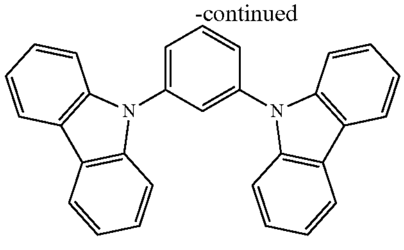

mCP

H50

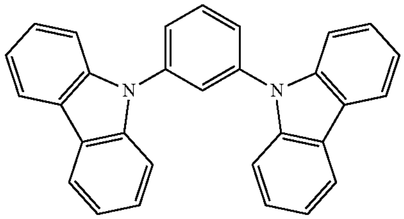

H51

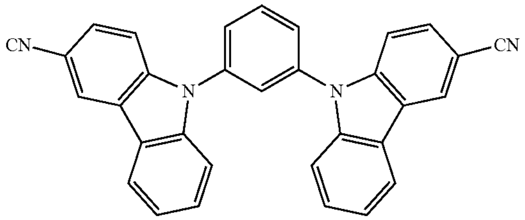

H52

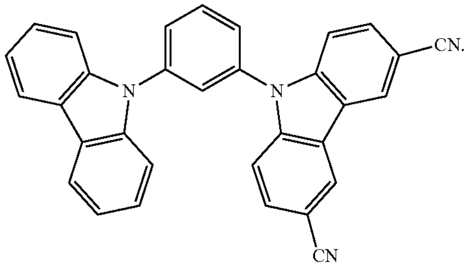

In one or more embodiments, the host may further include a compound represented by Formula 301:

Formula 301

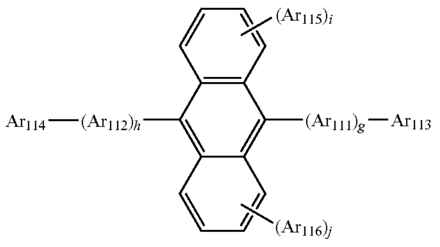

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with at least one of a phenyl group, a naphthyl group, an anthracenyl group, or a combination thereof.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; and a phenyl group, a naphthyl group, a phenanthrenyl group, or a pyrenyl group, each substituted with at least one of a phenyl group, a naphthyl group, an anthracenyl group, or a combination thereof.

g, h, i, and j in Formula 301 may each independently be an integer from 0 to 4, and may be, for example, 0, 1, or 2.

$Ar_{113}$ and $Ar_{116}$ in Formula 301 may each independently be:

a $C_1$-$C_{10}$ alkyl group substituted with at least one of a phenyl group, a naphthyl group, an anthracenyl group, or a combination thereof;

a phenyl group, a naphthyl group, an anthracenyl group, a pyrenyl, a phenanthrenyl group, or a fluorenyl group;

a phenyl group, a naphthyl group, an anthracenyl group, a pyrenyl group, a phenanthrenyl group, or a fluorenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or a combination thereof; or

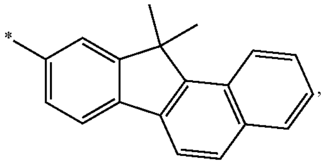 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

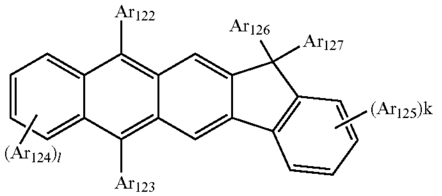

wherein, in Formula 302, $Ar_{122}$ to $Ar_{125}$ are each the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and I in Formula 302 may each independently be an integer from 0 to 4. For example, k and I may each be 0, 1, or 2.

When the emission layer includes a host and a dopant, an amount of the dopant may be in a range of about 0.01 part by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within the range described above, excellent light-emission characteristics may be obtained without a substantial increase in driving voltage.

Next, an electron transport region may be arranged on the emission layer.

The electron transport region may include at least one a hole blocking layer, an electron transport layer, an electron injection layer, or a combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be the same as the conditions for forming the hole injection layer.

When the electron transport region includes a hole blocking layer, the hole blocking layer may include, for example, at least one of BCP and Bphen, but embodiments of the present disclosure are not limited thereto:

BCP

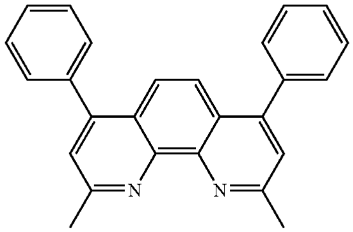

Bphen

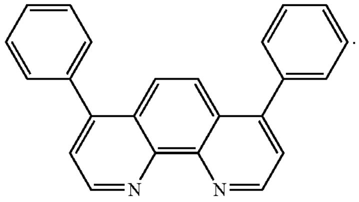

A thickness of the hole blocking layer may be in a range of about 20 Å to about 1,000 Å, for example, about 30 Å to about 300 Å. When the thickness of the hole blocking layer is within the range described above, excellent hole blocking characteristics may be obtained without a substantial increase in driving voltage.

The electron transport layer may further include at least one of BCP, Bphen, $Alq_3$, BAlq, TAZ, NTAZ, or a combination thereof:

$Alq_3$

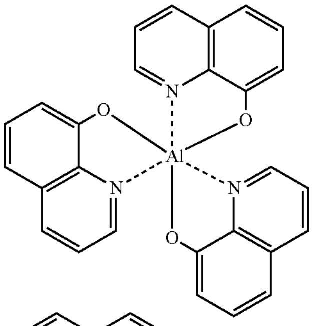

BAlq

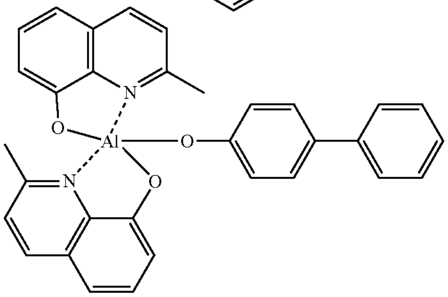

TAZ

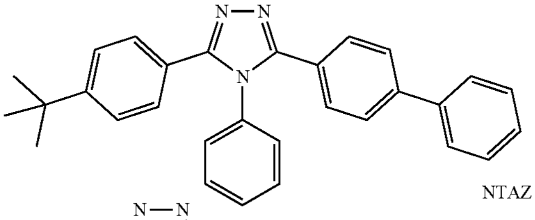

NTAZ

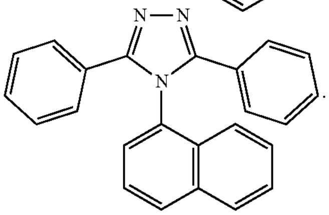

In one or more embodiments, the electron transport layer may include at least one of Compounds ET1 to ET25, but embodiments of the present disclosure are not limited thereto:

ET1

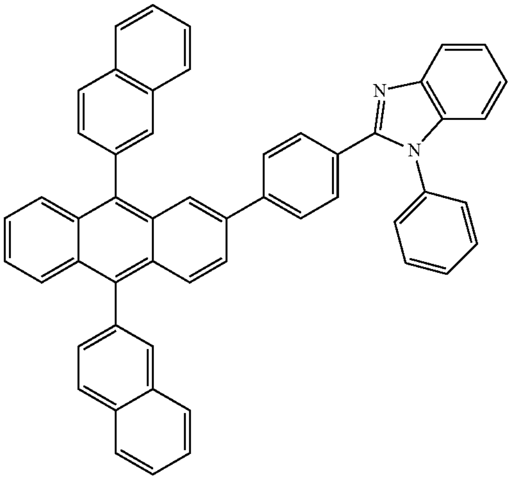

-continued
ET2
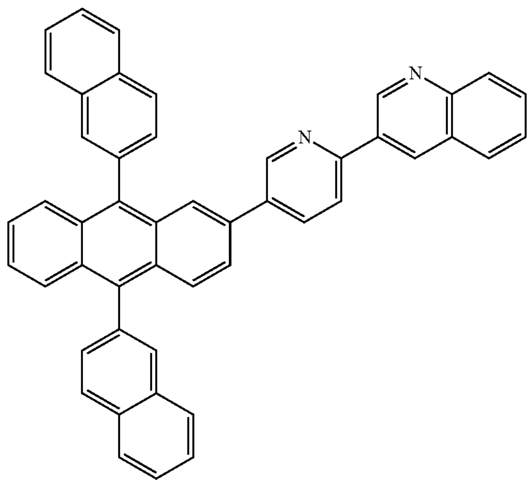
ET3
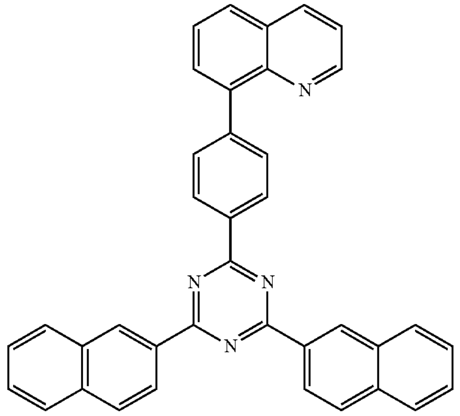
ET4
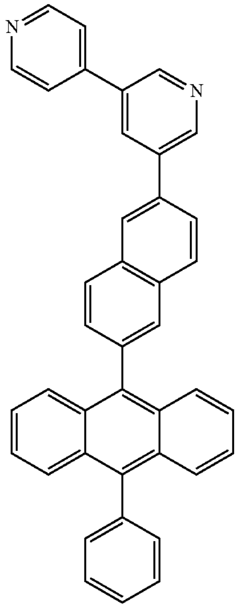
-continued
ET5
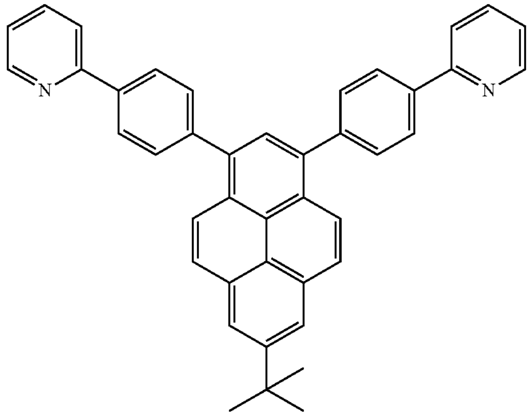
ET6
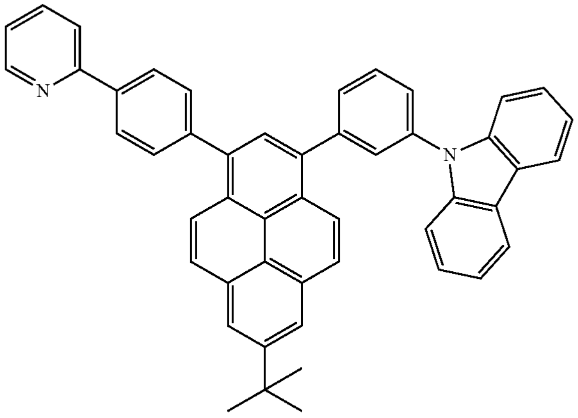
ET7
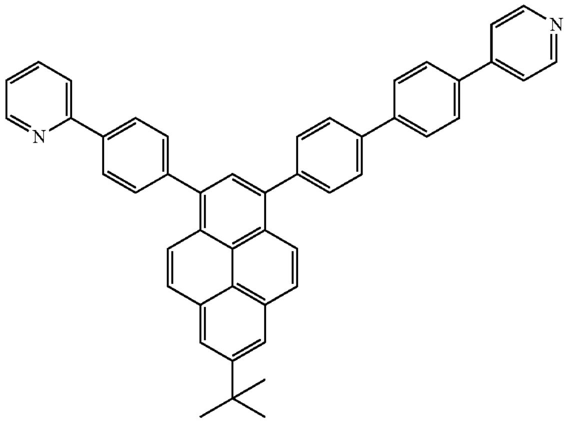

-continued
ET8
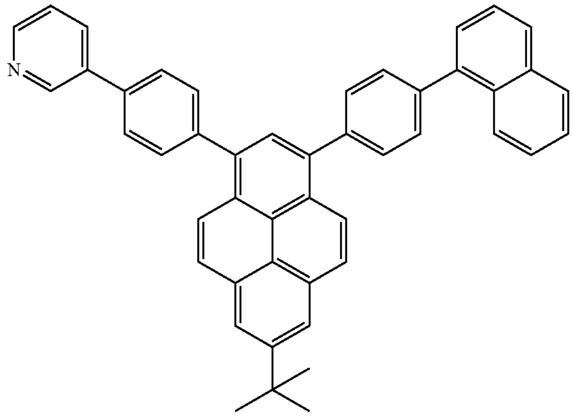
ET9
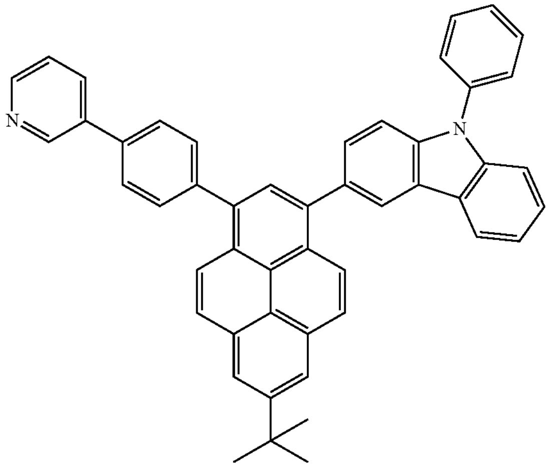
ET10
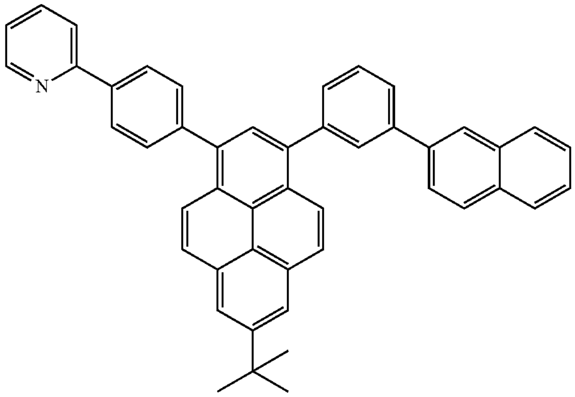
ET11
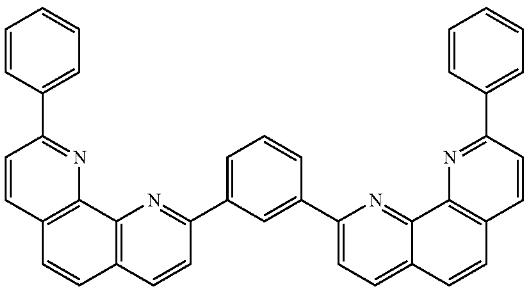
-continued
ET12
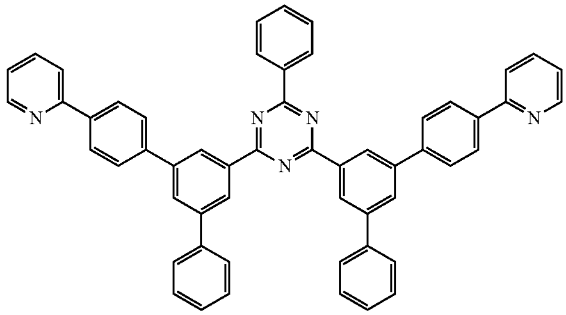
ET13
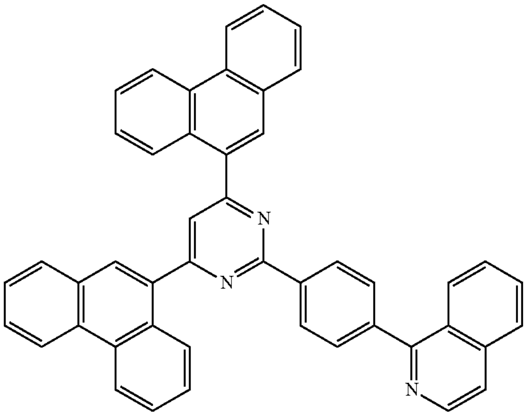
ET14
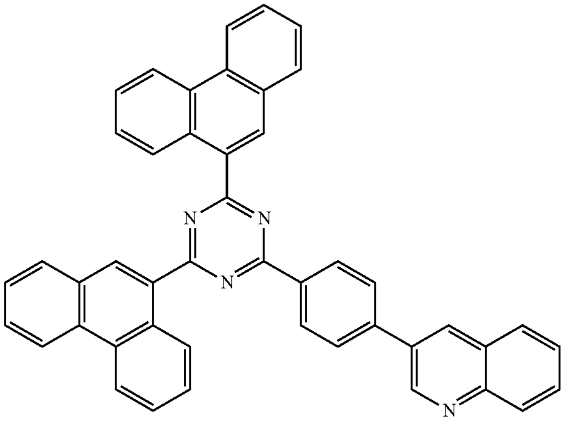
ET15
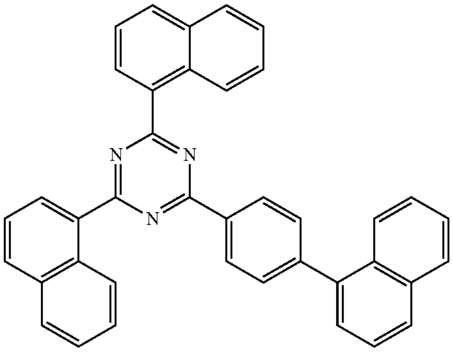

-continued
ET16
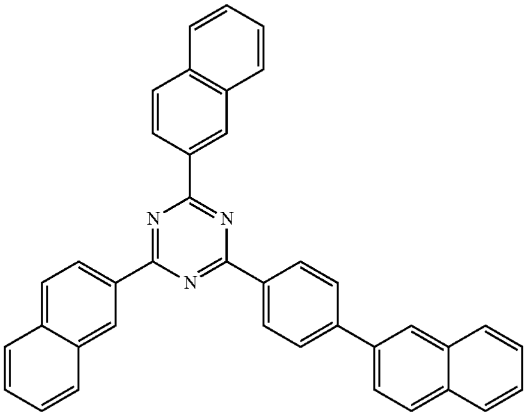
ET17
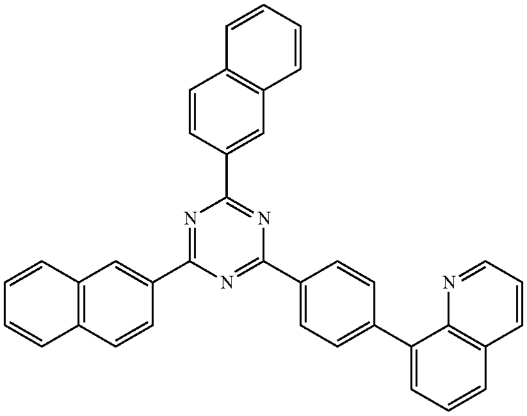
ET18
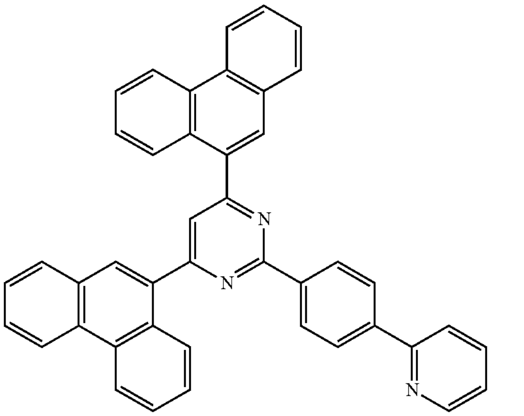
-continued
ET19
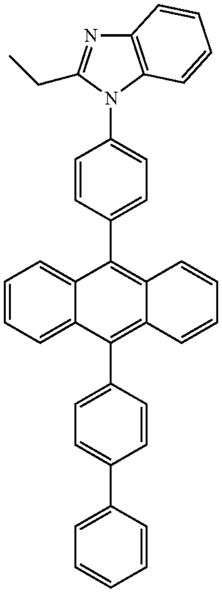
ET20
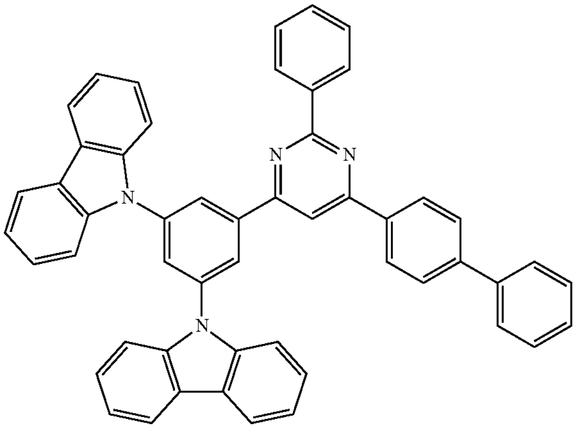
ET21
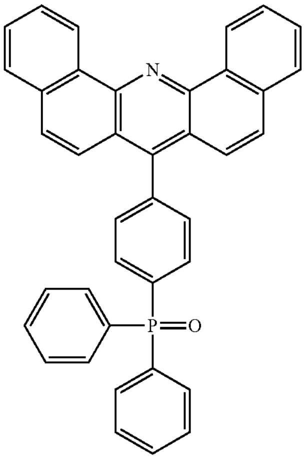

-continued

ET22

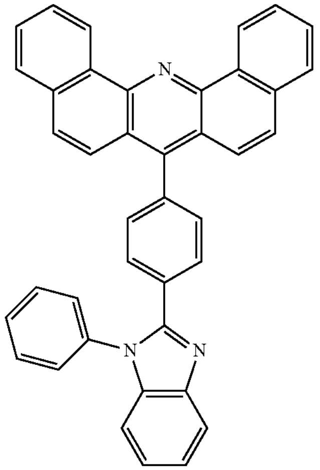

ET23

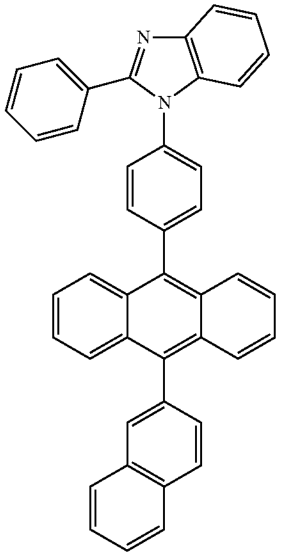

ET24

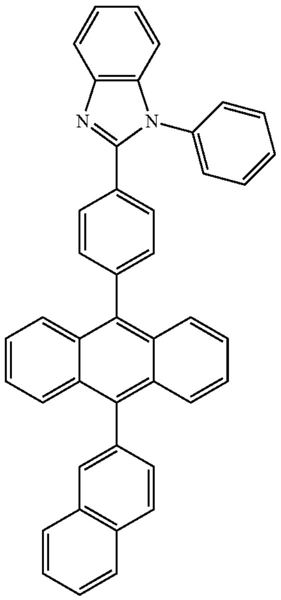

-continued

ET25

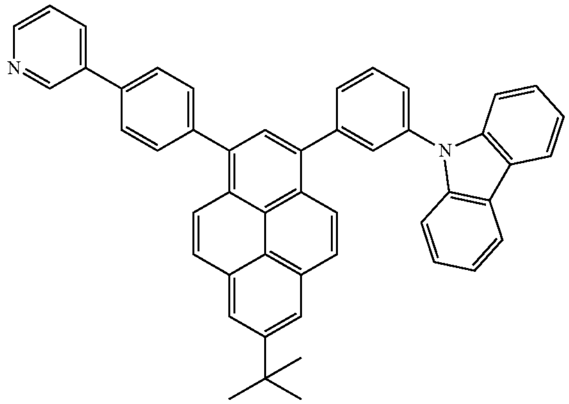

.

A thickness of the electron transport layer may be in a range of about 100 Å to about 1,000 Å, for example, about 150 Å to about 500 Å. When the thickness of the electron transport layer is within the range described above, satisfactory electron transporting characteristics may be obtained without a substantial increase in driving voltage.

The electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

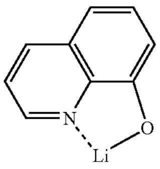

ET-D2

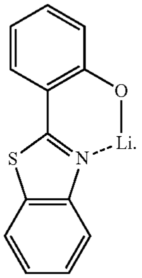

The electron transport region may include an electron injection layer that facilitates electron injection from the second electrode 19.

The electron injection layer may include at least one of LiF, NaCl, CsF, $Li_2O$, BaO, or a combination thereof.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 19 may be arranged on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device 10 has been described with reference to FIG. 1, but embodiments of the present disclosure are not limited thereto.

The term "$C_5$-$C_{30}$ carbocyclic group" as used herein refers to an aromatic or non-aromatic mono or polycyclic group having 1 to 30 carbon atoms. The term "$C_1$-$C_{30}$ heterocyclic group" refers to an aromatic or non-aromatic mono or polycyclic group having at least one heteroatom of B, N, O, Se, P, Si, Ge, and S as a ring-forming atom and 1 to 30 carbon atoms.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by-$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom of B, N, O, Se, P, Si, Ge, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom of B, N, O, Se, P, Si, Ge, and S as a ring-forming atom, 2 to 10 carbon atoms, and at least one double bond in the ring thereof. Examples of the $C_2$-$C_{10}$ heterocycloalkenyl group include a 2,3-hydrofuranyl group and a 2,3-hydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having at least one heteroatom of B, N, O, Se, P, Si, Ge, and S as a ring-forming atom and a carbocyclic aromatic system having 1 to 60 carbon atoms, and the term "$C_1$-$C_{60}$ heteroarylene group" as used herein refers to a divalent group having at least one heteroatom of B, N, O, Se, P, Si, Ge, and S as a ring-forming atom and a carbocyclic aromatic system having 1 to 60 carbon atoms. Examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein refers to —$OA_{102}$ (wherein Condition 1 $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$C_6$-$C_{60}$ arylalkyl group" as used herein refers to -$A_{104}A_{105}$ (wherein $A_{104}$ is a $C_1$-$C_{54}$ alkyl group, and $A_{105}$ is a $C_6$-$C_{59}$ aryl group), and includes, for example, a cumyl group.

The term "$C_1$-$C_{60}$ heteroarylalkyl group" as used herein refers to -$A_{104}A_{106}$ (wherein $A_{104}$ is a $C_1$-$C_{59}$ alkyl group, and $A_{106}$ is a $C_1$-$C_{59}$ heteroaryl group), the term "$C_1$-$C_{60}$ heteroaryloxy group" as used herein refers to —$OA_{107}$ (wherein $A_{107}$ is the $C_1$-$C_{60}$ heteroaryl group), and the term "$C_1$-$C_{60}$ arylthio group" as used herein refers to —$SA_{108}$ (wherein $A_{108}$ is the $C_1$-$C_{60}$ heteroaryl group).

The term "monovalent non-aromatic condensed polycyclic group" as used herein refers to a monovalent group having two or more rings condensed with each other, only carbon atoms (for example, having 8 to 60 carbon atoms) as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom of B, N, O, Se, P, Si, Ge, and S, other than carbon atoms (for example, having 2 to 60 carbon atoms), as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroarylalkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), —B($Q_{16}$)($Q_{17}$), —P(═O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one deuterium, —F, —Cl, —Br, —I,-$CD_3$,-$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$)—B($Q_{26}$)($Q_{27}$), —P(═O)($Q_{28}$)($Q_{29}$), or a combination thereof, or —Si($Q_{31}$)($Q_{32}$)($Q_{33}$), —N($Q_{34}$)($Q_{35}$), —B($Q_{36}$)($Q_{37}$), or —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

The term "room temperature" as used herein refers to a temperature of about 25° C.

The terms "a biphenyl group" and "a terphenyl group" as used herein refer to a monovalent group in which two or three benzene groups are bonded to each other through a single bond.

Hereinafter, a compound and an organic light-emitting device according to embodiments are described in detail with reference to Synthesis Examples and Examples.

However, the present disclosure is not limited thereto. The wording "B was used instead of A" used in describing Synthesis Examples means that an amount of A used was identical to an amount of B used, in terms of a molar equivalent.

EXAMPLES

Example 1

A substrate was prepared by ultrasonic cleaning with a quartz detergent, washing well with ion-exchanged water, and then ultrasonic cleaning with acetone and isopropanol for 100 minutes. Compound A-1 (2.2 mg) and Compound B-1 (1.0 mg) were weighed, added to toluene (1 mL), irradiated with ultrasonic waves for 30 minutes, and then overheated at 60° C. for 2 hours. 2 mL of a toluene solution including polystyrene (PS) with a certain concentration (PS/toluene (g/mL)=2.0/20) was added to the reaction solution, which was further irradiated with ultrasonic waves for 5 minutes. The obtained solution was drop-cast on the quartz substrate cleaned in the above order under a nitrogen atmosphere, thereby preparing a film. The obtained film was dried under nitrogen for 2 hours and then annealed in a vacuum oven at 60° C. for 2 hours, thereby obtaining a film containing Coordination Compound 3.

Example 2

A substrate was prepared by ultrasonic cleaning with a quartz detergent, washing well with ion-exchanged water, and then ultrasonic cleaning with acetone and isopropanol for 10 minutes. 0.5 mL of a toluene solution including 2-chloronaphthalene (2-chloronaphthalene/toluene (mg/mL)=7.2/10) was added to Compound A-1 (2.2 mg), and 0.5 mL of toluene was further added thereto. The reaction solution was irradiated with ultrasonic waves for 30 minutes and then heated at 60° C. for 2 hours. 2 mL of a toluene solution including PS with a certain concentration (PS/toluene (g/mL)=2.0/20) was added to the reaction solution, which was further irradiated with ultrasonic waves for 5 minutes.

The obtained solution was drop-cast on the quartz substrate cleaned in the above order under a nitrogen atmosphere, thereby preparing a film. The obtained film was dried under nitrogen for 2 hours and then annealed in a vacuum oven at 60° C., thereby obtaining a film containing Coordination Compound 4.

Comparative Example 1

A substrate was prepared by ultrasonic cleaning with a quartz detergent, washing well with ion-exchanged water, and then ultrasonic cleaning with acetone and isopropanol for 10 minutes. Compound A-1 (2.2 mg) was weighed, toluene (1 mL) was added thereto, and ultrasonic waves were irradiated thereto for 30 minutes, followed by heating at 60° C. for 2 hours. 2 mL of a toluene solution including PS with a certain concentration (PS/toluene (g/mL)=2.0/20) was added to the reaction solution, which was further irradiated with ultrasonic waves for 5 minutes. The obtained solution was drop-cast on the quartz substrate cleaned in the above order under a nitrogen atmosphere, thereby preparing a film. The obtained film was dried under nitrogen for 2 hours and then annealed in a vacuum oven at 60° C. for 2 hours, thereby obtaining a film containing Comparative Compound A-1.

Comparative Example 2

A substrate was prepared by ultrasonic cleaning with a quartz detergent, washing well with ion-exchanged water, and then ultrasonic cleaning with acetone and isopropanol for 10 minutes. Compound B-1 (2.2 mg) was weighed, toluene (1 mL) was added thereto, and ultrasonic waves were irradiated thereto for 30 minutes, followed by heating at 60° C. for 2 hours. 2 mL of a toluene solution including PS with a certain concentration (PS/toluene (g/mL)=2.0/20) was added to the reaction solution, which was further irradiated with ultrasonic waves for 5 minutes. The obtained solution was drop-cast on the quartz substrate cleaned in the above order under a nitrogen atmosphere, thereby preparing a film. The obtained film was dried under nitrogen for 2 hours and then annealed in a vacuum oven at 60° C. for 2 hours, thereby obtaining a film containing Comparative Compound B-1.

Comparative Example 3

A substrate was prepared by ultrasonic cleaning with a quartz detergent, washing well with ion-exchanged water, and then ultrasonic cleaning with acetone and isopropanol for 10 minutes. Compound A-1 (2.2 mg) was weighed, toluene (1 mL) was added thereto, and ultrasonic waves were irradiated thereto for 30 minutes, followed by heating at 60° C. for 2 hours. 2 mL of a toluene solution including poly(methyl methacrylate) (PMMA) with a certain concentration (PMMA/toluene (g/mL)=2.0/20) was added to the reaction solution, which was further irradiated with ultrasonic waves for 5 minutes. The obtained solution was drop-cast on the quartz substrate cleaned in the above order under a nitrogen atmosphere, thereby preparing a film. The obtained film was dried under nitrogen for 2 hours and then annealed in a vacuum oven at 60° C. for 2 hours, thereby obtaining a film containing Comparative Compound A-1.

TABLE 2

| | Host | Dopant | Host/dopant mixing ratio |
|---|---|---|---|
| Example 1 | PS | Compound 3 | 200 mg:2 mg |
| Example 2 | PS | Compound 4 | 200 mg:2 mg |
| Comparative Example 1 | PS | Compound A-1 | 200 mg:2 mg |
| Comparative Example 2 | PS | Compound B-1 | 200 mg:2 mg |
| Comparative Example 3 | PMMA | Compound A-1 | 200:2 mg |

Compound 3

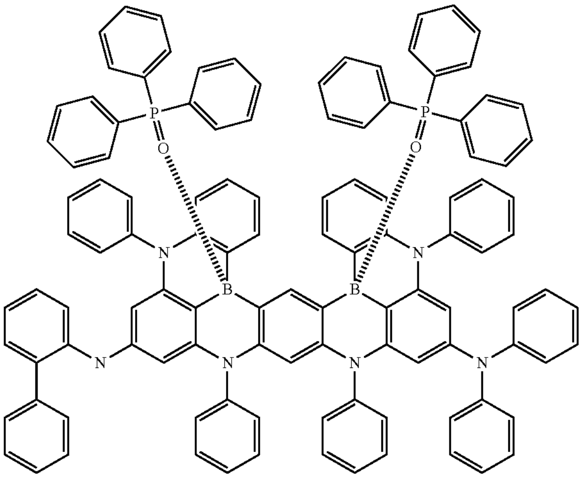

Compound 4

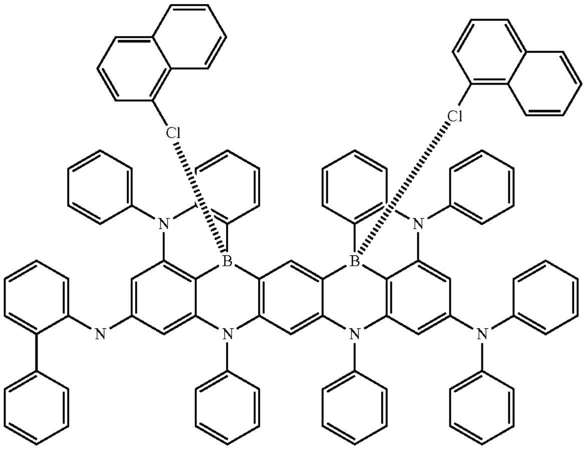

TABLE 2-continued

| | Host | Dopant | Host/dopant mixing ratio |
|---|---|---|---|

Compound A-1

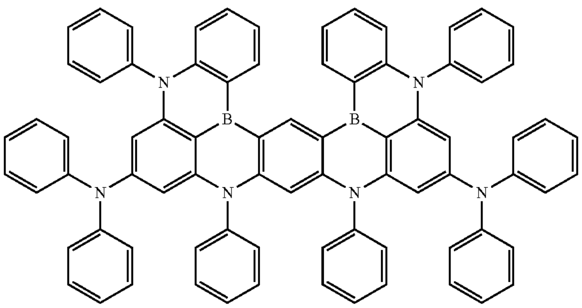 [SMILES: c1ccc(N(c2ccccc2)c2cc3c4c(c2)N(c2ccccc2)c2cc5c(cc2B4c2ccccc2N3c2ccccc2)B2c3ccccc3N(c3ccccc3)c3cc(N(c4ccccc4)c4ccccc4)cc(c32)N5c2ccccc2)cc1]

Compound B-1

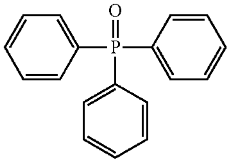 [SMILES: O=P(c1ccccc1)(c1ccccc1)c1ccccc1]

Evaluation Example 1: Material Simulation Evaluation

The energy levels of Compound 1 and Compound A (Compound 1 in which a triphenylphosphine group is not included) were calculated using the Gaussian 09 program, and the results are shown in Table 1.

TABLE 1

| Compound | HOMO (eV) | LUMO (eV) | $S_1$ (eV) | $T_1$ (eV) |
|---|---|---|---|---|
| Compound 1 | −4.15 | −1.39 | 2.60 | 2.57 |
| Compound A | −4.75 | −1.09 | 3.17 | 2.69 |

Figure 2:
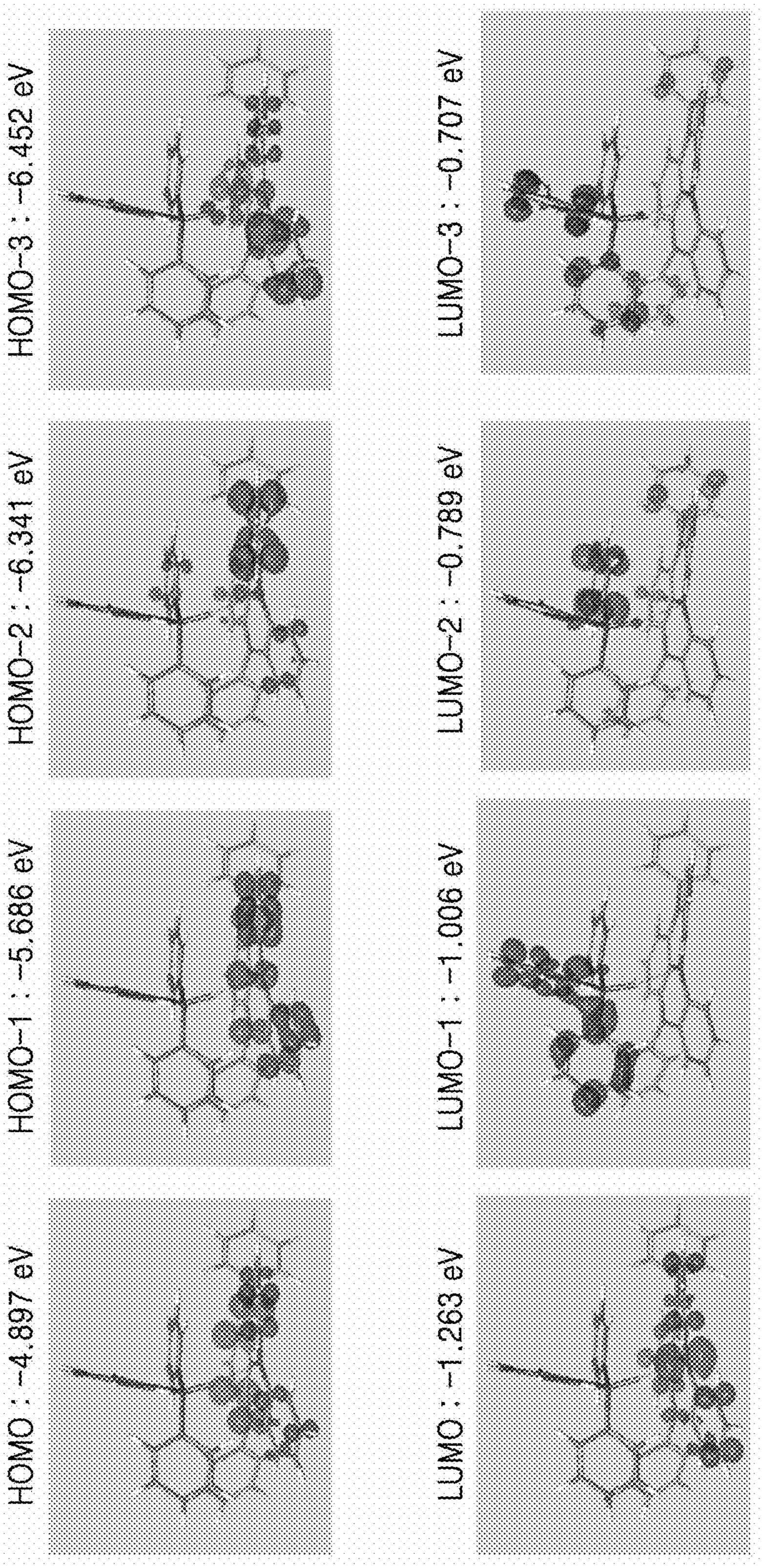
FIG. 2 shows a highest occupied molecular orbital (HOMO)—lowest unoccupied molecular orbital (LUMO) distribution of Compound 1.

The HOMO-LUMO distribution of Compound 1 was calculated using the Materials Science Suite 2021-3, MS Maestro program, and the results are shown in FIG. 2.

Compound 1

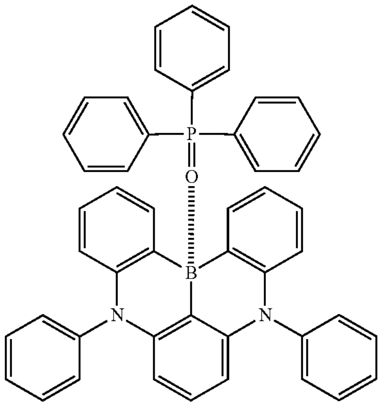

-continued

Compound A

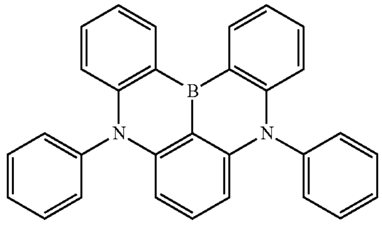

As shown in Table 1, in the case of Compound 1 in which a triphenylphosphine group is bonded to boron, it may be predicted that as an energy gap between Si and $T_1$ becomes smaller, reverse intersystem crossing may be processed quickly. As a result, it may be predicted that $k_{RISC}$ may be accelerated in Compound 1.

Figure 3:
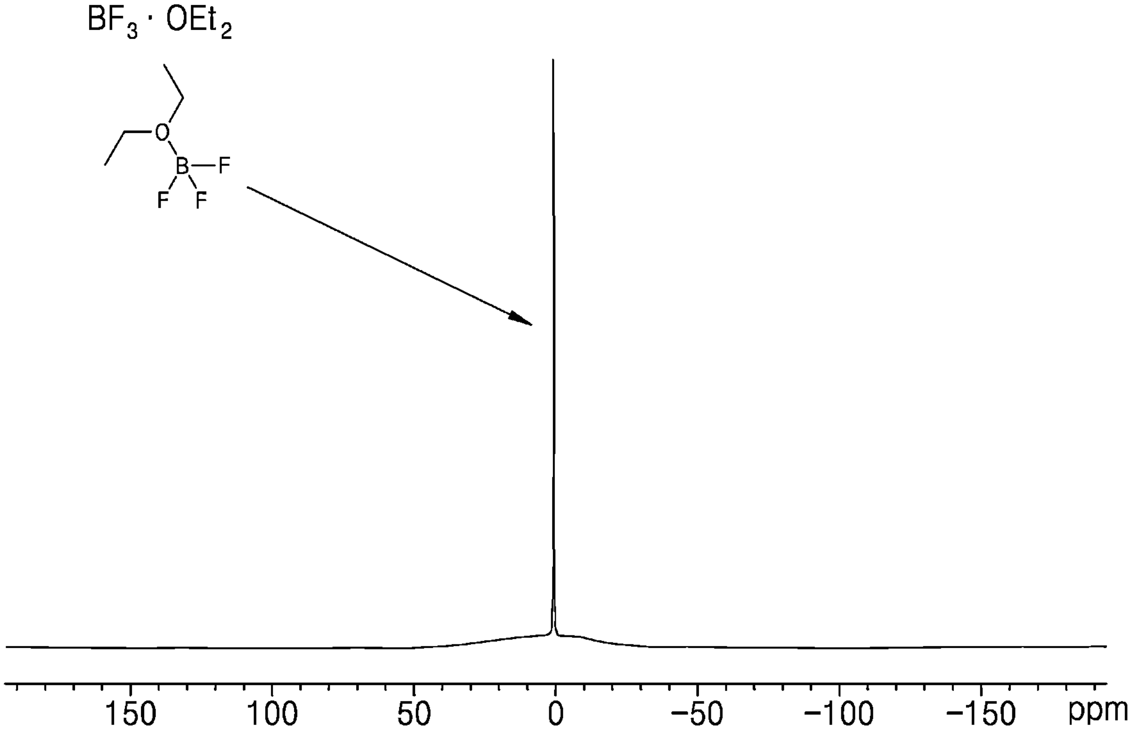
FIG. 3 shows a nuclear magnetic resonance (NMR) graph using $BF_3OEt_2$ as a sample for measuring NMR data.

Evaluation Example 2: Compound Structure Confirmation $^{11}$B-NMR of the structures of Compound 1 and Compound A was measured using Bruker 500 mHz NMR. $BF_3OEt_2$ was used as a standard material, and the value of $BF_3OEt_2$ was set to 0 ppm. The measurement was performed by introducing a sample dissolved in dry toluene-D8 into a dried quartz NMR tube. The NMR data for the sample are shown in FIG. 3.

Each of Compound 1 and Compound A dissolved in dry toluene-D8 was introduced into a dried quartz NMR tube to obtain NMR data. The NMR data for Compound 1 is shown in FIG. 4, and the NMR data for Compound A is shown in FIG. 5.

Figure 4:
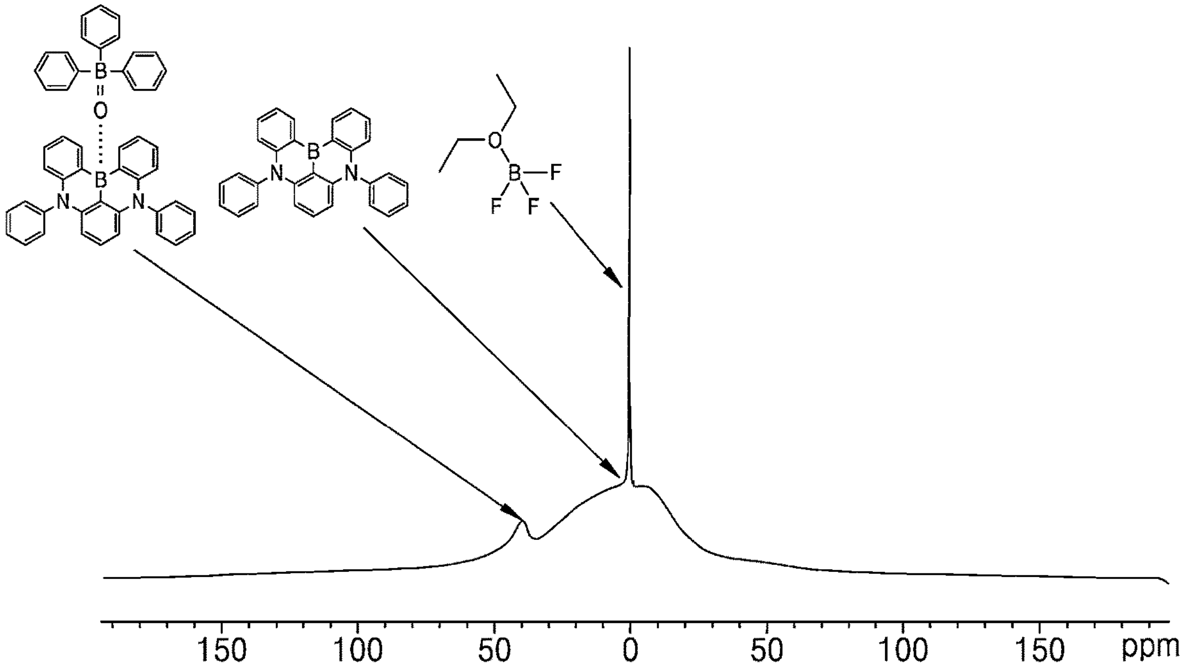
FIG. 4 shows an NMR graph for Compound 1.
Figure 5:
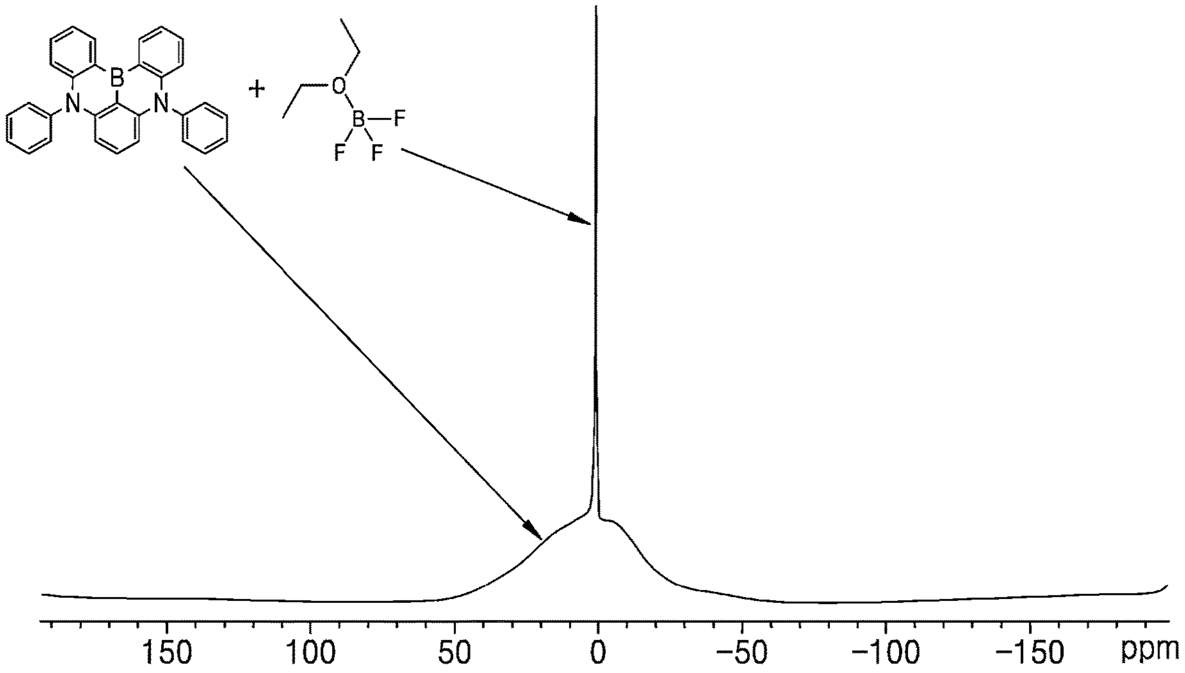
FIG. 5 shows an NMR graph for Compound A.

Referring to FIG. 4, Compound 1 was observed to have a relatively sharp peak around 39.8 ppm in the $^{11}$B-NMR spectrum. Referring to FIG. 5, Compound A was observed to have a broad peak around 70.0 ppm to −60.0 ppm in the $^{11}$B-NMR spectrum.

Evaluation Example 3: Compound Structure Analysis

Figure 6:
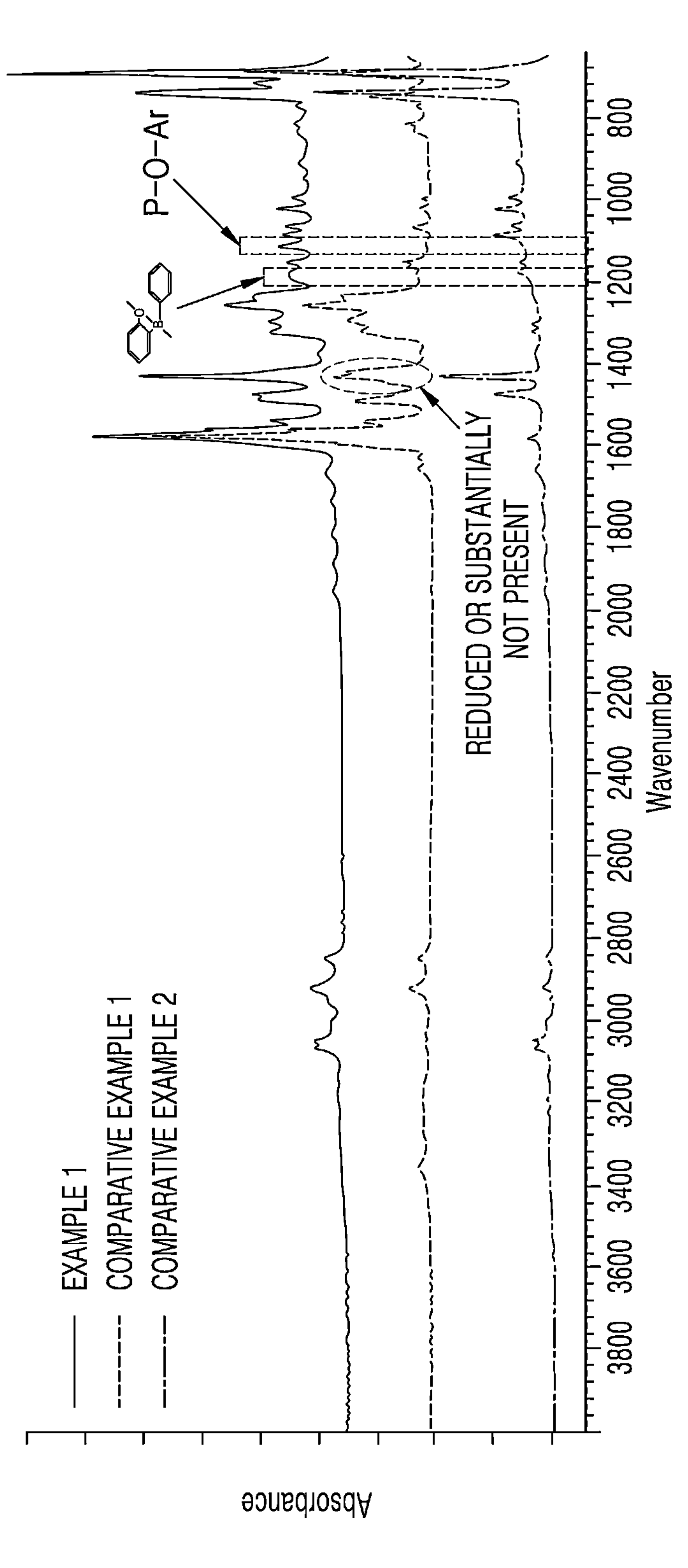
FIG. 6 shows infrared (IR) spectra for films of Example 1 and Comparative Examples 1 and 2.

The infrared (IR) spectrum of each of the films prepared in Example 1 and Comparative Examples 1 and 2 was measured, and the results are shown in FIG. 6.

Referring to FIG. 6, in the case of the IR spectrum of Compound 3, it was confirmed that a peak derived from aryl boron was reduced around 1,400 $cm^{-1}$, a new peak was generated through interaction with P═O around 1,200 $cm^{-1}$ and 780 $cm^{-1}$, and a new peak derived from P—O—Ar was observed around 1,120 $cm^{-1}$.

That is, it was confirmed that, in Compound 3, a triphenylphosphine group was bonded or coordinated to a boron atom as an axial substituent.

Figure 7:
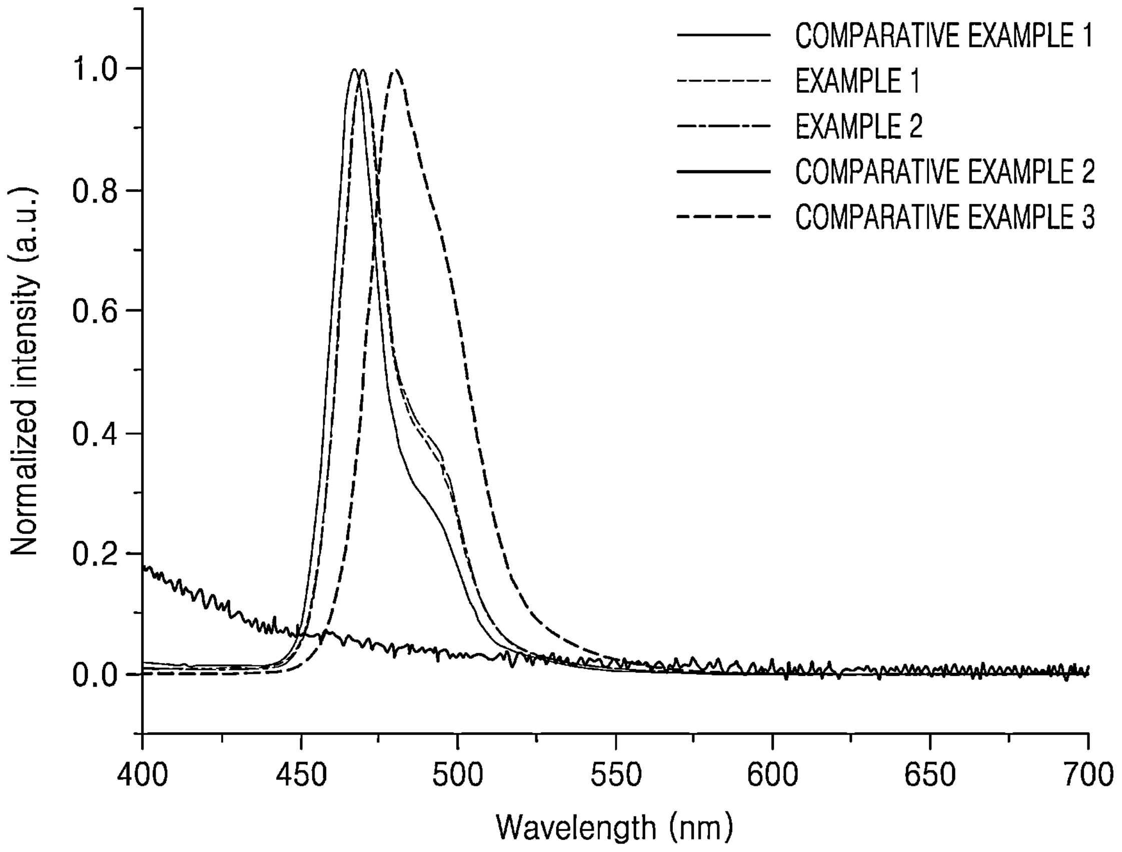
FIG. 7 shows photoluminescence (PL) curves for Examples 1 and 2 and Comparative Examples 1 to 3.

Evaluation Example 4: Evaluation of photoluminescence (PL) quantum yield (PLQY) and decay time (1) PLQY Evaluation The PLQY of each of the films prepared in Examples 1 and 2 and Comparative Examples 1 to 3 above was measured using the Hamamatsu Photonics absolute PL quantum yield measurement system, which is equipped with a xenon light source, a monochromator, a photonic multichannel analyzer, and an integrating sphere and employs a PLQY measurement software (available from Hamamatsu Photonics, Ltd., Shizuoka, Japan), and the results are shown in FIG. 7. It was confirmed that the films of Examples 1 and 2 each showed PLQY substantially equivalent to that of Compound A, which is a blue luminescent compound of the related art. Thus, it can be seen that the introduction of an axial substituent does not cause a decrease in PLQY.

(2) Decay Time Evaluation

The PL spectrum of each of the films prepared in Examples 1 and 2 and Comparative Example 1 was evaluated at room temperature by using the time-resolved PL (TRPL) measuring system FluoTime 300 available from PicoQuant Inc. and the pumping source PLS340 available from PicoQuant Inc. (excitation wavelength=340 nm, spectral width=20 nm). Then, the wavelength of the main peak of the spectrum was determined, and the number of photons emitted from the respective film at the wavelength of the main peak by a photon pulse (pulse width=500 ps) applied by PLS340 to the respective film was repeatedly measured based on time-correlated single photon counting (TCSPC), thereby obtaining a sufficiently fittable TRPL curve.

Figure 8:
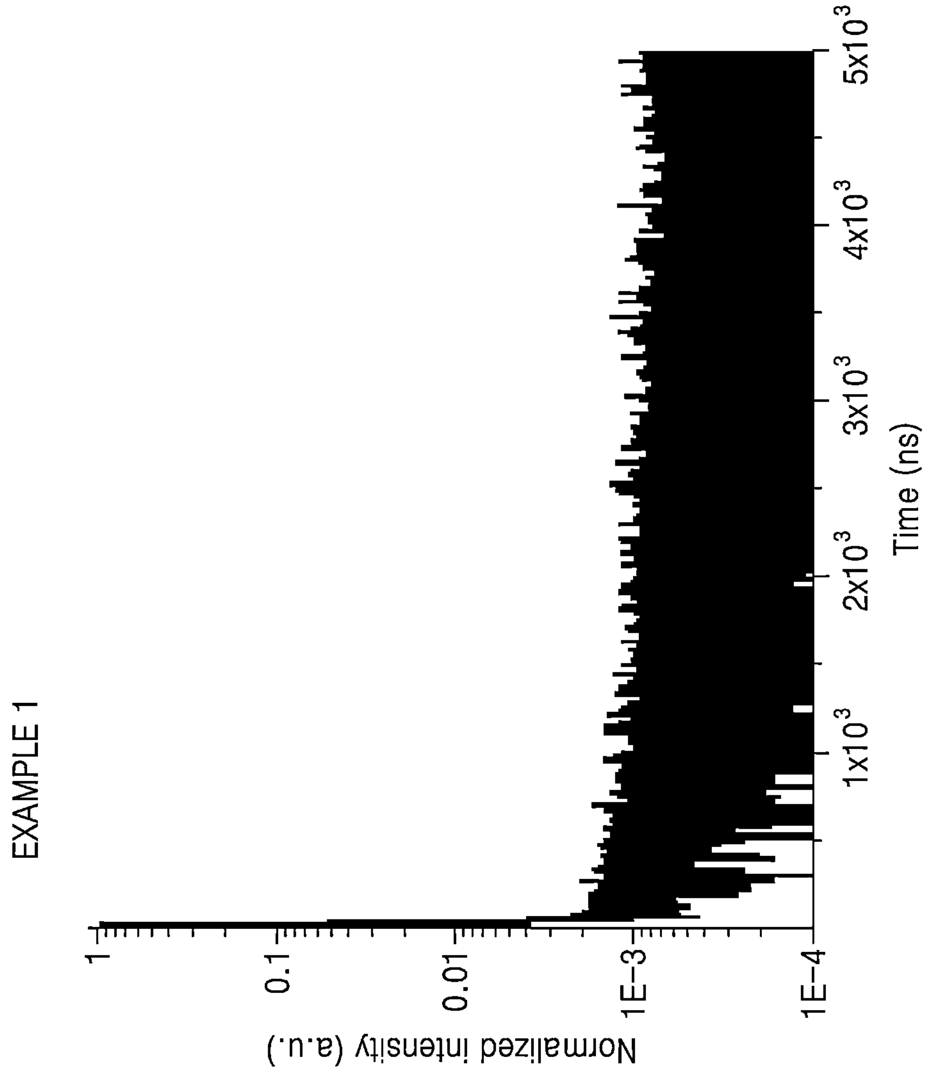
FIG. 8 shows a time-resolved PL (TRPL) curve for Example 1.
Figure 8:
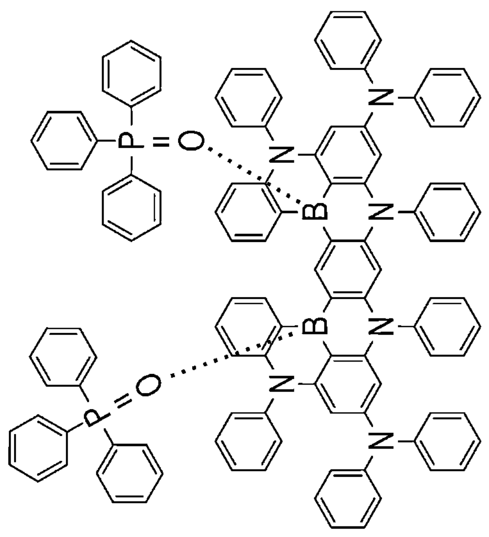
Figure 9:
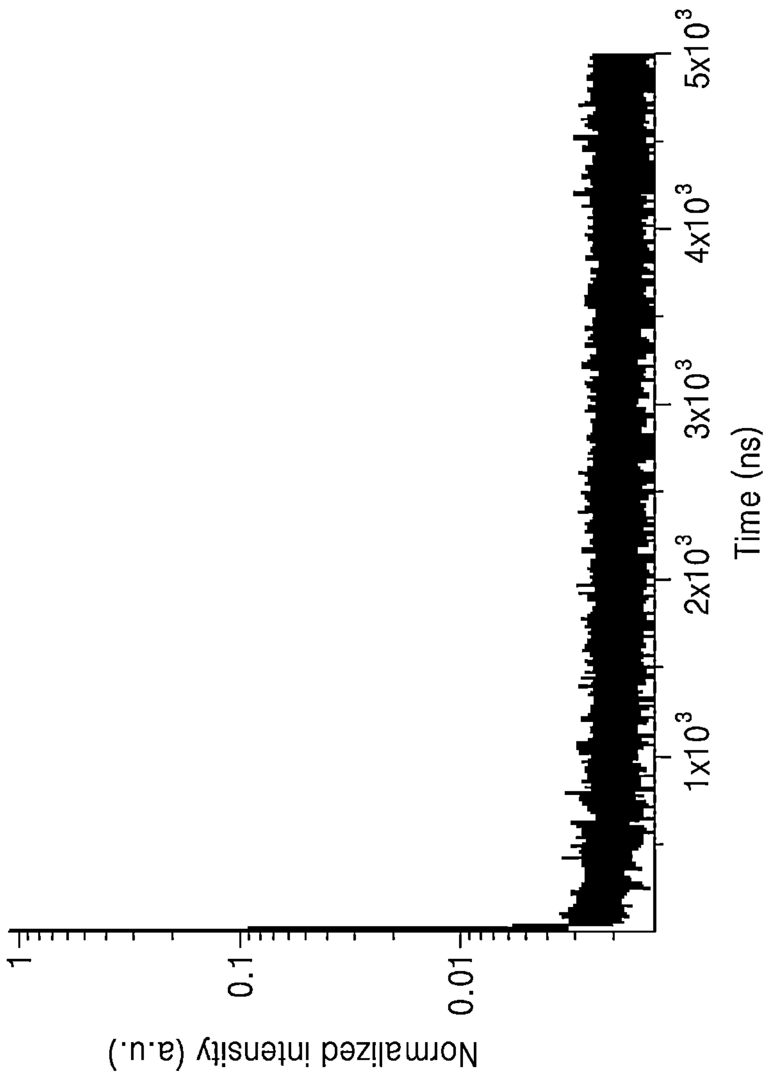
FIG. 9 shows a TRPL curve for Example 2.
Figure 9:
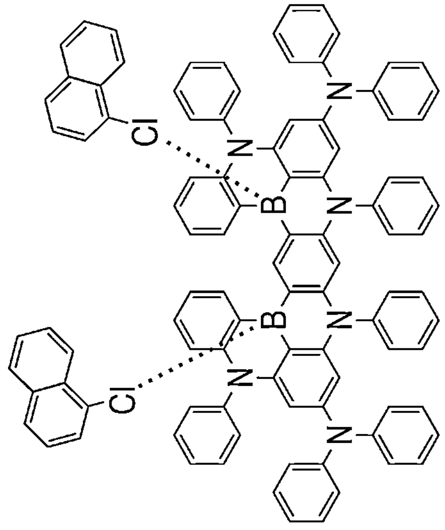
Figure 10:
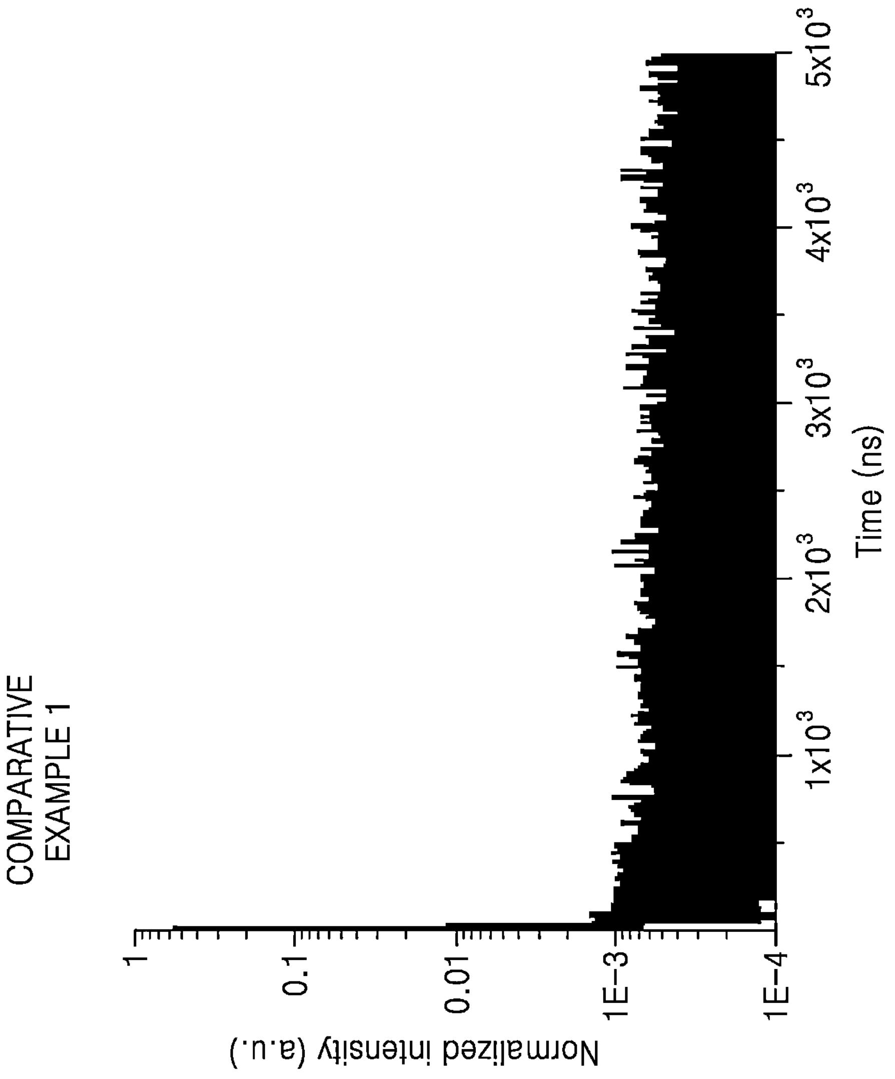
FIG. 10 shows a TRPL curve for Comparative Example 1.
Figure 10:
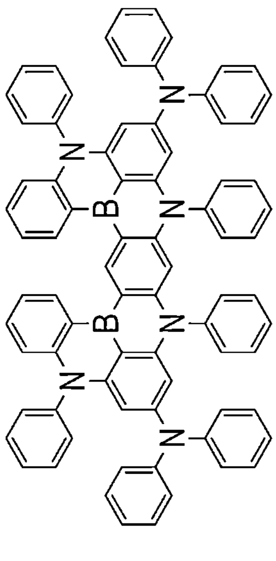

Two or more exponential decay functions were fitted to the results obtained from FIGS. 8 to 10, thereby obtaining $T_{decay}$(Ex) (decay time) of the respective film. A function for fitting is as shown in Equation 1, and from among $T_{decay}$ values obtained from each exponential decay function used for fitting, the largest $T_{decay}$ was obtained as $T_{decay}$ (Ex), which is shown in Table 3. The rest of the $T_{decay}$ values may be used to determine the decay lifespan of normal fluorescence. In this regard, the same measurement was performed during the same measurement time as that for obtaining TRPL curve in the dark state (in which pumping signals entering a film are blocked) to obtain a baseline or a background signal curve for use as a baseline for fitting.

Fitting was separately performed for a prompt component (fluorescence component) and a delay component (thermally activated delayed fluorescence (TADF) component), and fitting was performed on each component with a first- or second-order exponential decay function. For the average lifespan in the case of fitting with the second-order exponential decay function, the following formula was adopted as a statistical method for matching photon count and t to an equivalent.

$$\tau_{ave} = \frac{\sum_i A_i \tau_i^2}{\sum_i A_i \tau_i}$$

The fitting curves are as shown in FIGS. 8 to 10. The baseline with the lowest intensity (a.u.) of the decay curve was determined by performing measurement while pumping signals were blocked for the same time as the TRPL measurement time. The measurement time was taken as the time at which the intensity (a.u.) of the decay curve overlapped the baseline. □ of prompt and delay obtained by the above method is shown in Table 3.

Optical properties such as $k_{RISC}$, etc. were obtained through the Adachi method.

$\Phi$=total PLQY $\Phi_F$=PLQY of fluorescence component $\Phi_{TADF}$=PLQY of TADF component $\tau_f$=emission lifetime of fluorescence $\tau_{TADF}$=emission lifetime of TADF $k_F=\Phi_F/\tau_F$ (1)

$\Phi=k_F/(k_F+k_{IC})$ (2)

$\Phi_F=k_F/(k_F+k_{IC}+k_{ISC})$ (3)

$\Phi_{IC}=k_{IC}/(k_F+k_{IC}+k_{ISC})$ (4)

$\Phi_{ISC}=1-\Phi_F-\Phi_{IC}=k_{ISC}/(k_F+k_{IC}+k_{ISC})$ (5)

$k_{TADF}=\Phi_{TADF}/\Phi_{ISC}\ \tau_{TADF}$ (6)

$k_{RISC}=k_F k_{TADF}\Phi_{TADF}/k_{ISC}\Phi F$ (7)

$K_{nr}=K_{IC}+K_{ISC}$ (8)

TABLE 3

| | $\Phi$ | $\Phi_f$ | $\Phi_{TADF}$ | $\tau_f$(s) |
|---|---|---|---|---|
| Example 1 | 0.938 | 0.830 | 0.109 | 5.246E−09 |
| Example 2 | 0.938 | 0.787 | 0.151 | 4.22E−09 |
| Comparative Example 1 | 0.90 | 0.82 | 0.008 | 4.1E−09 |

TABLE 4

| | $\tau_{TADF}$(s) | $K_f$ ($s^{-1}$) | $k_{nr}$ ($s^{-1}$) | $k_{ISC}$ ($s^{-1}$) | $k_{RISC}$ ($s^{-1}$) |
|---|---|---|---|---|---|
| Example 1 | 1.82E−06 | 1.58E+08 | 1.05E+07 | 2.19E+07 | 6.02E+05 |
| Example 2 | 3.04E−06 | 1.86E+08 | 1.23E+07 | 3.82E+07 | 3.88E+05 |
| Comparative Example 1 | 4.1E−06 | 2.00E+07 | 2.17E+07 | 2.32E+07 | 2.01E+05 |

Due to the inclusion of a luminescent material, for example, a coordination compound, having a higher $k_{RISC}$ value than known compounds included in an emission layer of the related art, the film according to an embodiment of the present disclosure may be suitable for manufacturing of a light-emitting device having high efficiency and long lifespan characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A film comprising a coordination compound represented by $A_1(L_1)_{n1}$, wherein $A_1$ is a heterocyclic compound represented by Formula 1-1, and ligand $L_1$ in the number n1 comprises an electron donor atom:

Formula 1-1

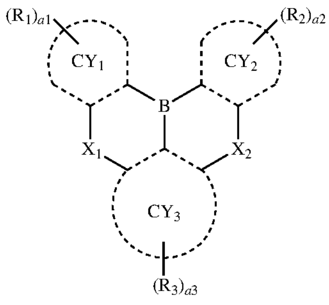

wherein, in Formula 1-1, ligand $L_1$ is bonded to boron (B) which is a central element in Formula 1-1, wherein the bond between boron (B) of $A_1$ and ligand $L_1$ is a coordinate bond, n1 represents the number of ligand(s) $L_1$ and is 1 or 2, ring $CY_1$ to ring $CY_3$ are each independently a $C_5$-$C_{30}$ carbocyclic group or a $C_1$-$C_{30}$ heterocyclic group, $X_1$ is O, S, Se, $N(R_4)$, $C(R_4)(R_5)$, $Ge(R_4)(R_5)$, or $Si(R_4)(R_5)$, $X_2$ is O, S, Se, $N(R_6)$, $C(R_6)(R_7)$, $Ge(R_4)(R_5)$, or $Si(R_6)(R_7)$, $R_1$ to $R_7$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroarylalkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(=O)(Q_8)(Q_9)$, or a combination thereof, a1 to a3 are each independently an integer from 1 to 10, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroarylalkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$N(Q_{14})(Q_{15})$, —$B(Q_{16})(Q_{17})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_6$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{24})(Q_{25})$—$B(Q_{26})(Q_{27})$, —$P(=O)(Q_{28})(Q_{29})$, or a combination thereof; or $Si(Q_{31})(Q_{32})(Q_{33})$, —$N(Q_{34})(Q_{35})$, —$B(Q_{36})(Q_{37})$, or —$P(=O)(Q_{38})(Q_{39})$, and $Q_1$ to $Q_9$ $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ arylalkyl group, a $C_6$-$C_{60}$ aryloxy group, a $C_6$-$C_{60}$ arylthio group, a $C_1$-$C_{60}$ heteroaryl group, a $C_1$-$C_{60}$ heteroarylalkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, wherein a $k_{RISC}$ value of the coordination compound is $3\times10^5$/s or more.

2. The film of claim 1, wherein ligand $L_1$ is a monodentate ligand or a bidentate ligand.

3. The film of claim 1, wherein ligand $L_1$ is a phosphine group, a halogen group, a cyano group, a hydroxyl group, a thiol group, an alkoxy group, an imine group, or an organic group comprising one or more of these groups.

4. The film of claim 1, wherein a B atom in Formula 1-1 is coordinated with the electron donor atom of ligand $L_1$, and the electron donor atom of ligand $L_1$ is oxygen of a phosphine group, a halogen group, carbon of a cyano group, oxygen of a hydroxyl group, sulfur of a thiol group, oxygen of an alkoxy group, or nitrogen of an amine group.

5. The film of claim 1, wherein ligand $L_1$ is bonded to a B atom in a group represented by Formula 1-1 in an axial direction with respect to a plane formed by ring $CY_1$, ring $CY_2$, and ring $CY_3$.

6. The film of claim 1, wherein ring $CY_1$, ring $CY_2$, and ring $CY_3$ are each independently a benzene group, a naphthalene group, a fluorene group, a pyridine group, a pyrimidine group, a pyrazine group, a quinoline group, an isoquinoline group, a quinazoline group, a quinoxaline group, a phthalazine group, a carbazole group, an azacarbazole group, a dibenzofuran group, a dibenzothiophene group, a dibenzoselenophene group, a dibenzosilole group, a dibenzoborole group, an azadibenzofuran group, an azadibenzothiophene group, an azadibenzoselenophene group, an azadibenzosilole group, an azadibenzoborole group, or a group represented by Formula a:

Formula a

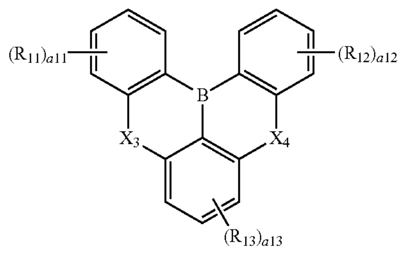

wherein, in Formula a, $X_3$ is O, S, Se, $N(R_{14})$, $C(R_{14})(R_{15})$, $Ge(R_{14})(R_{15})$, or $Si(R_{14})(R_{15})$, $X_4$ is O, S, Se, $N(R_{16})$, $C(R_{16})(R_{17})$, $Ge(R_{16})(R_{17})$, or $Si(R_{16})(R_{17})$, $R_{11}$ to $R_{17}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroarylalkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, a11 and a12 are each independently an integer from 1 to 4, and a13 is an integer from 1 to 3.

7. The film of claim 1, wherein $X_1$ is O, S, $N(R_4)$, $C(R_4)(R_5)$, or $Si(R_4)(R_5)$, and $X_2$ is O, S, $N(R_4)$, $C(R_4)(R_5)$, or $Si(R_4)(R_5)$.

8. The film of claim 1, wherein $X_1$ and $X_2$ are identical to each other.

9. The film of claim 1, wherein $R_1$ to $R_7$ are each independently:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, or a combination thereof;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_6$-$C_{60}$ arylalkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —$Si(Q_{31})(Q_{32})(Q_{33})$, —$N(Q_{34})(Q_{35})$, —$B(Q_{36})(Q_{37})$, —$P(=O)(Q_{38})(Q_{39})$, or a combination thereof; or —$N(Q_1)(Q_2)$, —$Si(Q_3)(Q_4)(Q_5)$, —$B(Q_6)(Q_7)$, or —$P(=O)(Q_8)(Q_9)$, and $Q_1$ to $Q_9$ and $Q_{31}$ to $Q_{39}$ are each independently hydrogen, deuterium, a $C_1$-$C_{20}$ alkyl group, a $C_1$-$C_{20}$ alkoxy group, a phenyl group, a biphenyl group, a phenyl group and a biphenyl group that are each substituted with at least one of deuterium, a $C_1$-$C_{20}$ alkyl group, and a $C_1$-$C_{20}$ alkoxy group, a pyridinyl group, a pyrimidinyl group, a pyrazinyl group, a pyridazinyl group, a carbazole group, a dibenzofuranyl group, a dibenzothiophenyl group, or a dibenzosilolyl group.

10. The film of claim 1, wherein $R_1$ to $R_7$ are each independently:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, an amino group, a phenyl group, or a combination thereof;

—$N(Q_1)(Q_2)$; or a group represented by one of Formulae 4-1 to 4-42:

4-1

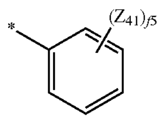

4-2

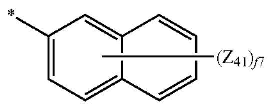

4-3

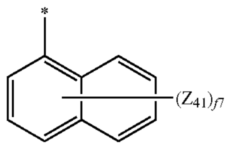

4-4

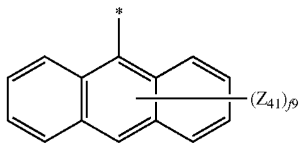

4-5

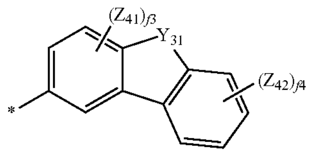

4-6

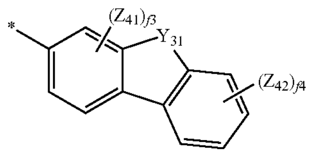

4-7

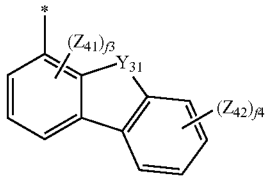

4-8

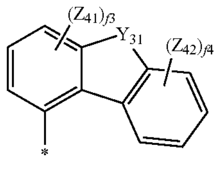

4-9

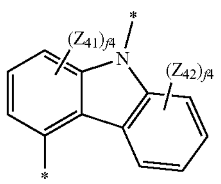

-continued
4-10
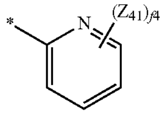
4-11
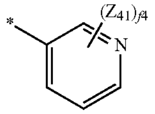
4-12
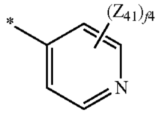
4-13
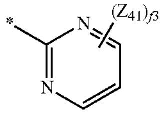
4-14
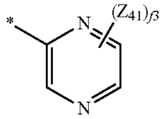
4-15
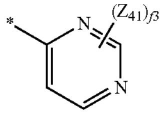
4-16
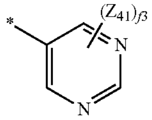
4-17
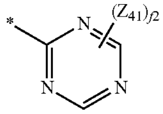
4-18
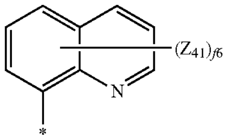
4-19
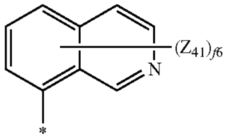
4-20
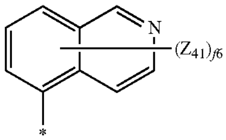
-continued
4-21
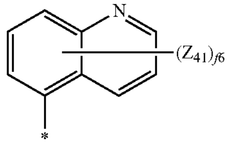
4-22
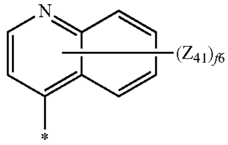
4-23
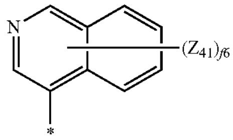
4-24
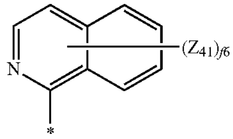
4-25
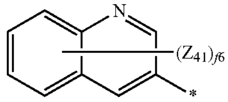
4-26
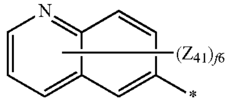
4-27
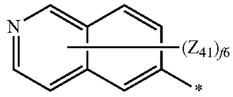
4-28
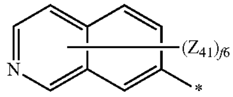
4-29
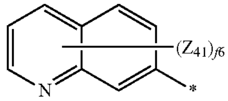
4-30
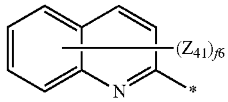
4-31
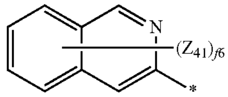
4-32
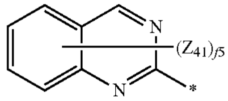

-continued

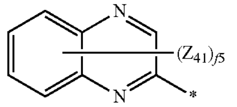

4-33

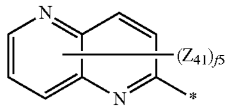

4-34

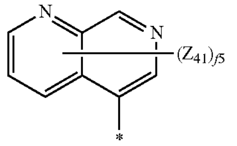

4-35

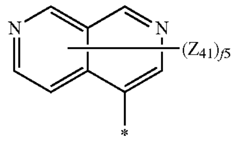

4-36

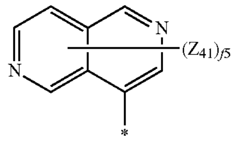

4-37

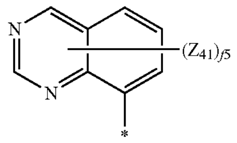

4-38

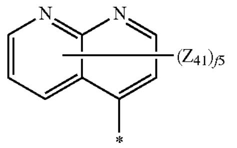

4-39

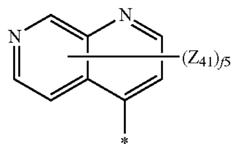

4-40

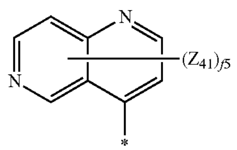

4-41

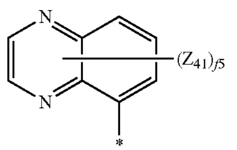

4-42 wherein, in Formulae 4-1 to 4-42, $Y_{31}$ is O, S, $C(Z_{45})(Z_{46})$, $N(Z_{47})$, or $Si(Z_{48})(Z_{49})$, $Z_{41}$ to $Z_{49}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ arylalkyl group, a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group; or a cyclopentyl group, a cyclohexyl group, a cycloheptyl group, a cyclopentenyl group, a cyclohexenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cumyl group, or a combination thereof, f3 is an integer from 1 to 3, f4 is an integer from 1 to 4, f5 is an integer from 1 to 5, f6 is an integer from 1 to 6, f7 is an integer from 1 to 7, f9 is an integer from 1 to 9, and indicates a binding site to a neighboring atom.

11. The film of claim 1, wherein Formula 1-1 is one of Formulae 2-1 to 2-7:

2-1

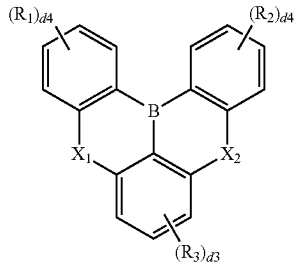

2-2

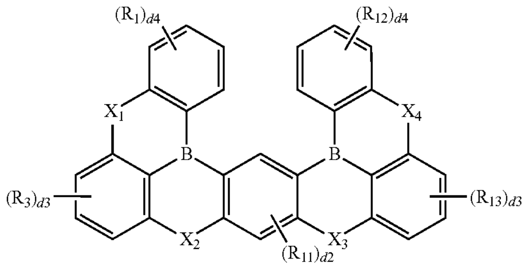

2-3

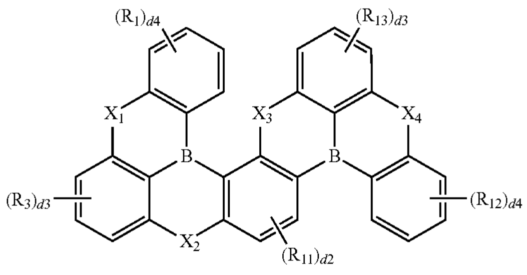

2-4

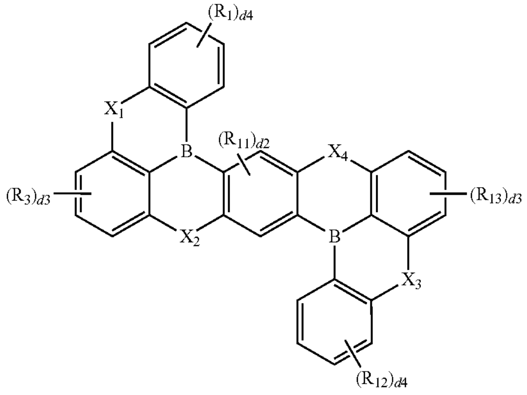

-continued 2-5

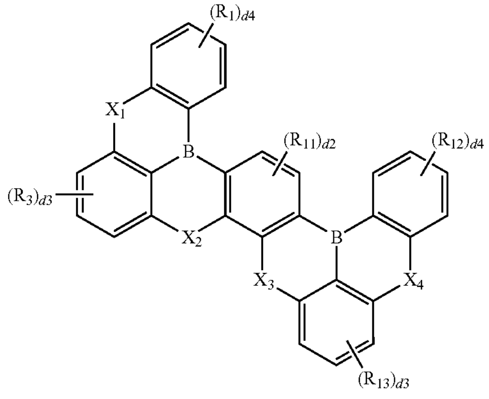

2-6

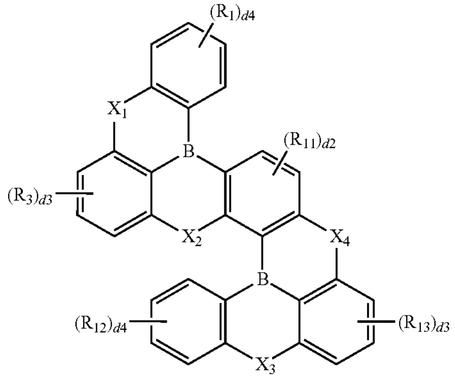

2-7

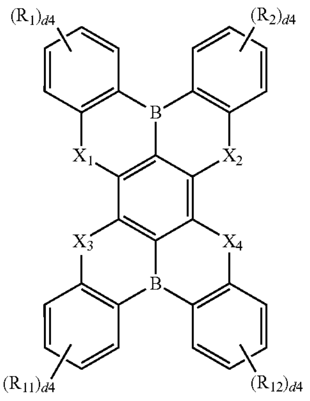

wherein, in Formulae 2-1 to 2-7, $R_1$ to $R_3$, $X_1$, and $X_2$ are respectively the same as those described in claim 1, $X_3$ is O, S, Se, $N(R_{14})$, $C(R_{14})(R_{15})$, $Ge(R_{14})(R_{15})$, or $Si(R_{14})(R_{15})$, $X_4$ is O, S, Se, $N(R_{16})$, $C(R_{16})(R_{17})$, $Ge(R_{16})(R_{17})$, or $Si(R_{16})(R_{17})$, $R_{11}$ to $R_{17}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroarylalkyl group, a substituted or unsubstituted $C_6$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, d2 is an integer from 1 to 2, d3 is an integer from 1 to 3, and d4 is an integer from 1 to 4.

12. The film of claim 1, wherein the film comprises a coordination compound of Compounds 1 to 5:

1

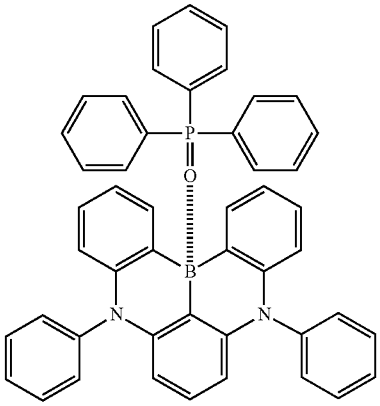

2

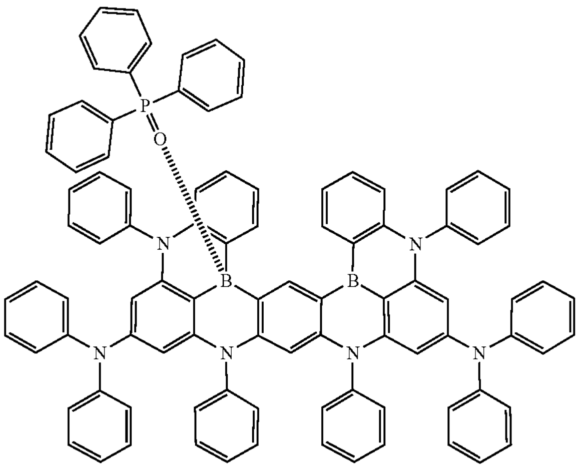

-continued

3

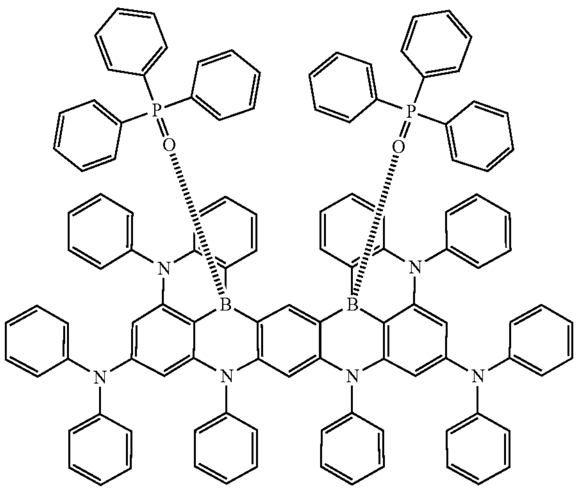

4

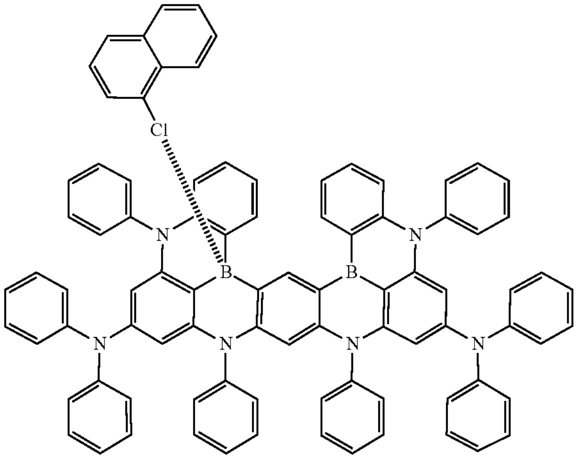

5

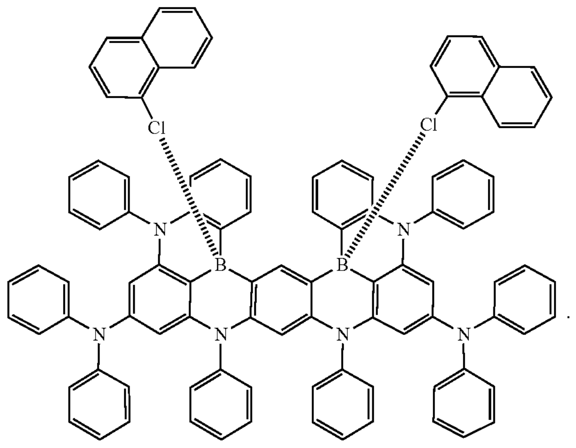

13. A light-emitting device comprising:

a first electrode;

a second electrode; and an organic layer arranged between the first electrode and the second electrode and comprising an emission layer, wherein the emission layer comprises the film of claim 1.

14. The light-emitting device of claim 13, wherein the emission layer emits fluorescent light.

15. The light-emitting device of claim 13, wherein the emission layer emits blue light having a wavelength band of about 440 nm to about 490 nm.

16. The light-emitting device of claim 13, wherein the emission layer further comprises a host compound, and an amount of the host compound in the emission layer is greater than 50 wt % based on a total weight of the film.

17. The light-emitting device of claim 16, wherein the emission layer further comprises a sensitizer satisfying Equation 1:

$$\Delta E_{ST} \leq 0.3 eV \quad \text{Equation 1}$$

wherein, $\Delta E_{ST}$ indicates a difference between lowest excited singlet ($S_1$) energy and lowest excited triplet ($T_1$) energy of the sensitizer.

18. The light-emitting device of claim 13, wherein the first electrode is an anode, the second electrode is a cathode, the organic layer further comprises a hole transport region arranged between the first electrode and the emission layer and an electron transport region arranged between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

19. An electronic apparatus comprising the light-emitting device of claim 13.

* * * * *